(12) United States Patent
Seo et al.

(10) Patent No.: US 12,724,049 B2
(45) **Date of Patent: *Sep. 1, 2026**

(54) ELECTRONIC DEVICE HAVING A TESTING METHOD FOR DETERMINING DEFECTS IN A SENSOR LAYER

(71) Applicant: Samsung Display Co., Ltd., Yongin-si (KR)

(72) Inventors: Eunsol Seo, Yongin-si (KR); Hyun-Wook Cho, Yongin-si (KR); Sangkook Kim, Yongin-si (KR); Taejoon Kim, Yongin-si (KR); Eungkwan Lee, Yongin-si (KR); Jaewoo Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 19/012,708

(22) Filed: Jan. 7, 2025

(65) Prior Publication Data

US 2025/0138070 A1 May 1, 2025

Related U.S. Application Data

(63) Continuation of application No. 18/340,678, filed on Jun. 23, 2023, now Pat. No. 12,216,144.

(30) Foreign Application Priority Data

Aug. 12, 2022 (KR) ........................ 10-2022-0101366

(51) Int. Cl.

*G01R 27/26* (2006.01)
*G06F 3/041* (2006.01)
*G06F 3/044* (2006.01)

(52) U.S. Cl.

CPC ..... *G01R 27/2605* (2013.01); *G06F 3/04166* (2019.05); *G06F 3/0443* (2019.05); *G06F 3/0446* (2019.05)

(58) Field of Classification Search

CPC ................................................. G01R 27/2605

(Continued)

(56) References Cited

U.S. PATENT DOCUMENTS 5,184,082 A 2/1993 Nelson
7,088,112 B2 8/2006 Yakabe (Continued)

FOREIGN PATENT DOCUMENTS

CN 113485575 A 10/2021
JP H 021890 A 1/1990

(Continued)

*Primary Examiner* — Long D Pham

(74) *Attorney, Agent, or Firm* — Womble Bond Dickinson (US) LLP

(57) ABSTRACT

In a method for testing an electronic device, the method includes: providing an electronic device including a display layer and a sensor layer on the display layer and configured to operate at a touch drive frequency, the sensor layer including a plurality of first electrodes and a plurality of second electrodes insulatively intersecting the plurality of first electrodes; providing a test signal having a test frequency higher than the touch drive frequency to the plurality of first electrodes; measuring mutual capacitance with the plurality of first electrodes through the plurality of second electrodes; and determining whether or not the sensor layer is defective, based on the mutual capacitance.

18 Claims, 15 Drawing Sheets

(58) Field of Classification Search
USPC .......................................................... 345/173
See application file for complete search history.

(56) References Cited

U.S. PATENT DOCUMENTS

| | | | | |
|---|---|---|---|---|
| 12,216,144 | B2 * | 2/2025 | Seo | G06F 3/04166 |
| 2012/0293455 | A1 * | 11/2012 | Shen | G06F 3/047 345/174 |
| 2016/0364068 | A1 * | 12/2016 | Cheng | G06F 3/0412 |
| 2020/0309846 | A1 * | 10/2020 | Barthel | G01R 23/14 |
| 2021/0004124 | A1 | 1/2021 | Park | |
| 2023/0289012 | A1 | 9/2023 | Grygorenko et al. | |

FOREIGN PATENT DOCUMENTS

| | | | |
|---|---|---|---|
| KR | 10-0654472 | B1 | 12/2006 |
| KR | 10-2018-0015024 | A | 2/2018 |
| KR | 10-2021-0005437 | A | 1/2021 |

* cited by examiner

FIG. 5

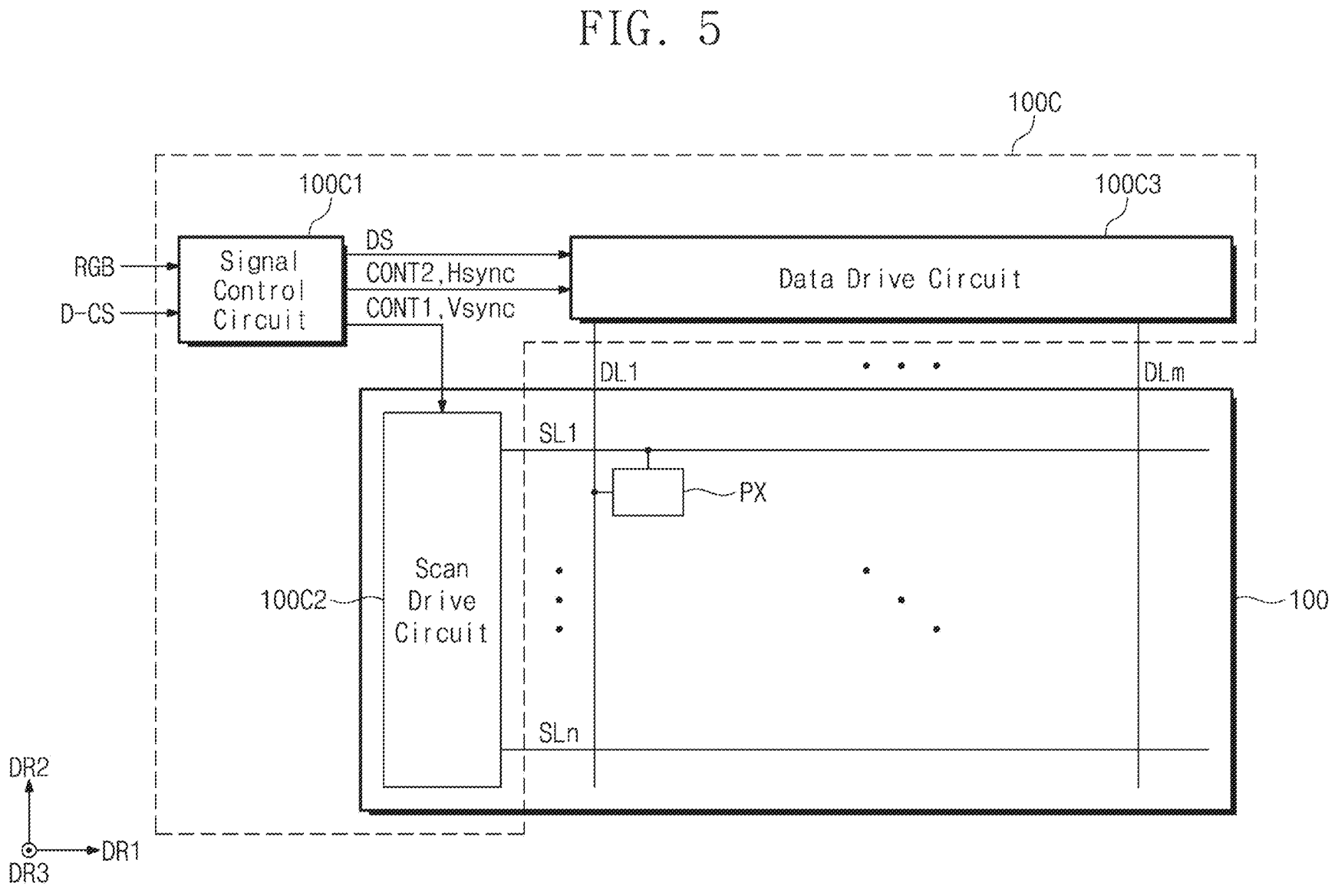

100C
100C3
100
Data Drive Circuit
DLm
DL1
PX
SL1
SLn
100C1
Signal Control Circuit
DS
CONT2, Hsync
CONT1, Vsync
Scan Drive Circuit
100C2
RGB
D-CS
DR1
DR2
DR3

ELECTRONIC DEVICE HAVING A TESTING METHOD FOR DETERMINING DEFECTS IN A SENSOR LAYER

CROSS-REFERENCE TO RELATED APPLICATIONS

The present application is a continuation of U.S. patent application Ser. No. 18/340,678, filed Jun. 23, 2023, which claims priority to and the benefit of Korean Patent Application No. 10-2022-0101366 filed on Aug. 12, 2022, in the Korean Intellectual Property Office, the entire disclosures of which are incorporated herein by reference.

BACKGROUND

1. Field

Aspects of some embodiments of the present disclosure described herein relate to an electronic device and an electronic device testing method having relatively improved reliability.

2. Description of the Related Art

An electronic device used in a smart phone, a television, a monitor, or the like includes various elements such as a display layer including a common electrode and a sensor layer. In order to enable relative reliability of the elements, a procedure for verifying operational characteristics of the elements and an electrical connection relationship between the elements may be desirable in a development and manufacturing processes.

The above information disclosed in this Background section is only for enhancement of understanding of the background and therefore the information discussed in this Background section does not necessarily constitute prior art.

SUMMARY

Aspects of some embodiments of the present disclosure include an electronic device and an electronic device testing method having relatively improved reliability.

According to some embodiments, an electronic device testing method includes providing an electronic device including a display layer and a sensor layer that is on the display layer and that operates at a touch drive frequency, the sensor layer including a plurality of first electrodes and a plurality of second electrodes that insulatively intersect the plurality of first electrodes, providing a test signal having a test frequency higher than the touch drive frequency to the plurality of first electrodes, measuring mutual capacitance with the plurality of first electrodes through the plurality of second electrodes, and determining whether the sensor layer is defective, based on the mutual capacitance.

According to some embodiments, the test frequency may range from 400 kilohertz (kHz) to 1 megahertz (MHz).

According to some embodiments, the measuring of the mutual capacitance may include measuring first mutual capacitance from one second electrode among the plurality of second electrodes and measuring second mutual capacitance from another second electrode among the plurality of second electrodes. The determining of whether the sensor layer is defective may include determining that the one second electrode among the plurality of second electrodes is open-circuited, when the first mutual capacitance and the second mutual capacitance differ from each other.

According to some embodiments, the providing of the test signal may include providing the test signal to one first electrode among the plurality of first electrodes and providing the test signal to another first electrode among the plurality of first electrodes. According to some embodiments, the measuring of the mutual capacitance may include measuring first mutual capacitance with the one first electrode among the plurality of first electrodes through the plurality of second electrodes and measuring second mutual capacitance with the other first electrode among the plurality of first electrodes through the plurality of second electrodes. According to some embodiments, the determining of whether the sensor layer is defective may include determining that the one first electrode among the plurality of first electrodes is open-circuited, when the first mutual capacitance and the second mutual capacitance differ from each other.

According to some embodiments, the determining of whether the sensor layer is defective may include determining that the sensor layer is defective, when a open circuit having a resistance of 1 kΩ to 500 kΩ occurs in one of the plurality of first electrodes and the plurality of second electrodes.

According to some embodiments, the sensor layer may further include a plurality of detection lines electrically connected with the plurality of first electrodes and the plurality of second electrodes, and the determining of whether the sensor layer is defective may include determining whether the plurality of detection lines are defective.

According to some embodiments, the measuring of the mutual capacitance may include measuring first mutual capacitance of one first electrode among the plurality of first electrodes and measuring second mutual capacitance of another adjacent first electrode among the plurality of first electrodes. According to some embodiments, the determining of whether the sensor layer is defective may include determining that the sensor layer is defective, when a percentage of a value obtained by dividing a difference between the first mutual capacitance and the second mutual capacitance by the second mutual capacitance is 20% or more.

According to some embodiments, the test frequency may include a plurality of test frequencies, and the plurality of test frequencies may include a first test frequency and a second test frequency higher than the first test frequency. According to some embodiments, the providing of the test signal may include providing a first test signal having the first test frequency to the plurality of first electrodes and providing a second test signal having the second test frequency to the plurality of first electrodes.

According to some embodiments, the measuring of the mutual capacitance may include measuring the first mutual capacitance, based on the first test signal and measuring the second mutual capacitance, based on the second test signal. According to some embodiments, the determining of whether the sensor layer is defective may include determining whether the sensor layer is defective, based on the first mutual capacitance and determining whether the sensor layer is defective, based on the second mutual capacitance.

According to some embodiments, the determining of whether the sensor layer is defective, based on the second mutual capacitance may be performed after the determining of whether the sensor layer is defective, based on the first mutual capacitance.

According to some embodiments, the electronic device may further include a controller that controls the sensor layer, and the providing of the test signal may include providing, by the controller, the test signal to the plurality of first electrodes.

According to some embodiments, an electronic device includes a display layer, a sensor layer that is located on the display layer and that operates at a touch drive frequency, the sensor layer including a plurality of first electrodes and a plurality of second electrodes that insulatively intersect the plurality of first electrodes, and a controller that controls the sensor layer. According to some embodiments, the controller provides a test signal having a test frequency higher than the touch drive frequency to the plurality of first electrodes, measures mutual capacitance with the plurality of first electrodes through the plurality of second electrodes, and determines whether the sensor layer is defective, based on the mutual capacitance.

According to some embodiments, the test frequency may range from 400 kilohertz (kHz) to 1 megahertz (MHz).

According to some embodiments, the plurality of first electrodes may include a plurality of detection patterns arranged in a first direction and at least one connecting pattern that connects two detection patterns adjacent to each other among the plurality of detection patterns, and the plurality of second electrodes may include a plurality of first portions arranged in a second direction crossing the first direction and a second portion that connects two first portions adjacent to each other among the plurality of first portions.

According to some embodiments, the connecting pattern and the second portion may be located in different layers.

According to some embodiments, the plurality of detection patterns and the plurality of first portions may have a mesh pattern.

According to some embodiments, the controller may measure first mutual capacitance from one second electrode among the plurality of second electrodes and may measure second mutual capacitance from another second electrode among the plurality of second electrodes. According to some embodiments, the controller may determine whether the sensor layer is defective, by comparing the first mutual capacitance and the second mutual capacitance.

According to some embodiments, the controller may determine that the one second electrode among the plurality of second electrodes is open-circuited, when the first mutual capacitance is less than the second mutual capacitance.

According to some embodiments, the one second electrode among the plurality of second electrodes may have a resistance of 1 kΩ to 500 kΩ when the open circuit occurs.

According to some embodiments, the sensor layer may further include a plurality of detection lines electrically connected with the plurality of first electrodes and the plurality of second electrodes, and the controller may determine whether the plurality of detection lines are defective, based on the mutual capacitance.

BRIEF DESCRIPTION OF THE DRAWINGS

The above and other characteristics and features of embodiments according to the present disclosure will become more apparent by describing in more detail aspects of some embodiments thereof with reference to the accompanying drawings.

FIG. 5 is a block diagram of a display layer and a display driver according to some embodiments of the present disclosure.

DETAILED DESCRIPTION

Figure 1:
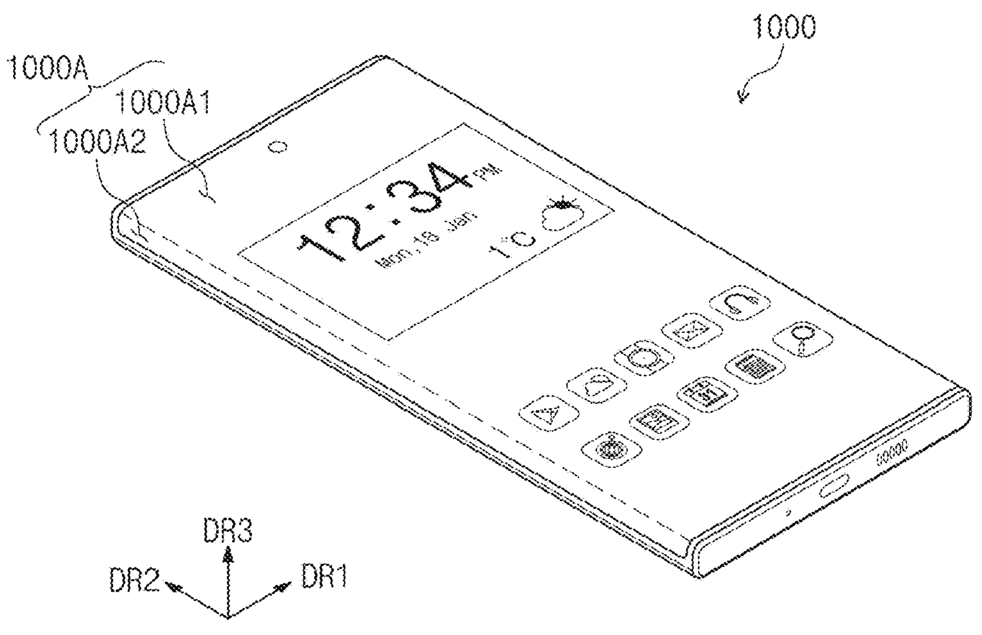
FIG. 1 is a perspective view of an electronic device according to some embodiments of the present disclosure.

In this specification, when it is mentioned that a component (or, a region, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, aspects of some embodiments of the present disclosure will be described in more detail with reference to the accompanying drawings.

FIG. 1 is a perspective view of an electronic device according to some embodiments of the present disclosure.

Referring to FIG. 1, the electronic device 1000 may include large electronic devices such as a television, a monitor, or a billboard. In addition, the electronic device 1000 may include small and medium-sized electronic devices such as a personal computer, a notebook computer, a personal digital terminal, a car navigation unit, a game machine, a smart phone, a tablet computer, or a camera. However, these are illustrative, and the electronic device 1000 may include other electronic devices without departing from the spirit and scope of the present disclosure. In FIG. 1, the electronic device 1000 is illustrated as a mobile phone.

The electronic device 1000 may display images at an active region 1000A. A first display surface 1000A1 parallel to a plane defined by a first direction DR1 and a second direction DR2 crossing the first direction DR1 and a second display surface 1000A2 extending from the first display surface 1000A1 may be defined in the active region 1000A.

The second display surface 1000A2 may be bent from one side of the first display surface 1000A1. Furthermore, a plurality of second display surfaces 1000A2 may be provided. In this case, the second display surfaces 1000A2 may be bent from at least two sides of the first display surface 1000A1. One first display surface 1000A1 and up to four second display surfaces 1000A2 may be defined in the active region 1000A. However, the shape of the active region 1000A is not limited thereto, and only the first display surface 1000A1 may be defined in the active region 1000A.

A thickness direction of the electronic device 1000 may be parallel to a third direction DR3 crossing the first direction DR1 and the second direction DR2. Accordingly, front surfaces (or, upper surfaces) and rear surfaces (or, lower surfaces) of members constituting the electronic device 1000 may be defined based on the third direction DR3.

Figure 2:
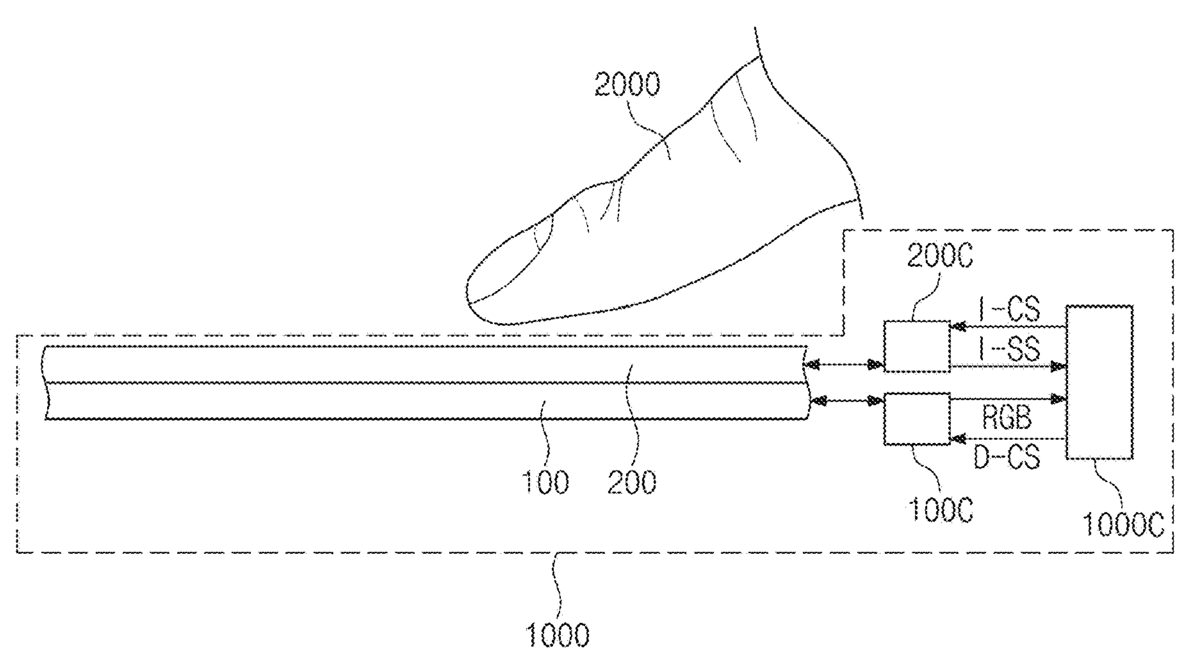
FIG. 2 is a schematic block diagram illustrating the electronic device according to some embodiments of the present disclosure.

FIG. 2 is a schematic block diagram illustrating the electronic device according to some embodiments of the present disclosure.

Referring to FIG. 2, the electronic device 1000 may include a display layer 100, a sensor layer 200, a display driver 100C, a controller 200C, and a main controller 1000C, among other components.

The display layer 100 may be a component that substantially generates or displays images. The display layer 100 may be an emissive display layer, but embodiments according to the present disclosure are not particularly limited. For example, the display layer 100 may be an organic light emitting display layer, a quantum-dot display layer, a micro-LED display layer, or a nano-LED display layer. An emissive layer of the organic light emitting display layer may include an organic light emitting material. An emissive layer of the quantum-dot display layer may include quantum dots and quantum rods. An emissive layer of the micro-LED display layer may include a micro-LED. An emissive layer of the nano-LED display layer may include a nano-LED.

The sensor layer 200 may be located on the display layer 100. The sensor layer 200 may detect an external input applied from the outside. The sensor layer 200 may operate in a first mode or a second mode. The first mode may be a test mode for determining whether the sensor layer 200 is defective. The second mode may be a mode for detecting an input by a touch of a user's body 2000.

The main controller 1000C may control an overall operation of the electronic device 1000. For example, the main controller 1000C may control operations of the display driver 100C and the controller 200C. The main controller 1000C may include at least one microprocessor. The main controller 1000C may be referred to as a host.

The display driver 100C may control the display layer 100. The main controller 1000C may further include a graphic controller. The display driver 100C may receive image data RGB and a control signal D-CS from the main controller 1000C. The control signal D-CS may include various signals. For example, the control signal D-CS may include an input vertical synchronization signal, an input horizontal synchronization signal, a main clock, and a data enable signal.

Based on the control signal D-CS, the display driver 100C may generate a vertical synchronization signal and a horizontal synchronization signal for controlling timing at which a signal is provided to the display layer 100. The vertical synchronization signal may define the duration of a frame of the display layer 100. That is, the period of a pulse of the vertical synchronization signal may be set to be the duration of the frame. The display layer 100 may operate at a drive frequency having the duration of the frame as a period.

The controller 200C may control the sensor layer 200. The controller 200C may receive a control signal I-CS from the main controller 1000C. The control signal I-CS may include a mode determination signal for determining a drive mode of the controller 200C and a clock signal. Based on the control signal I-CS, the controller 200C may operate in the first mode for providing a test signal having a test frequency or the second mode for detecting a second input by a touch. The controller 200C may control the sensor layer 200 in the first mode or the second mode, based on the mode determination signal.

In the second mode, the controller 200C may calculate coordinate information of a touch of the user's body 2000, based on a signal received from the sensor layer 200 and may provide a coordinate signal I-SS having the coordinate information to the main controller 1000C. The main controller 1000C may execute an operation corresponding to an input of the user, based on the coordinate signal I-SS. For example, based on the coordinate signal I-SS, the main controller 1000C may operate the display driver 100C to display a new application image on the display layer 100.

Figure 3A:
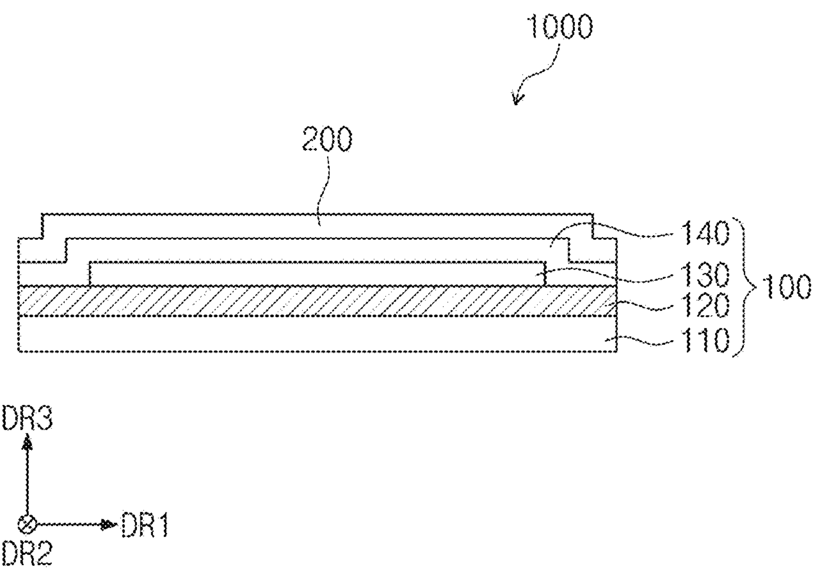
FIG. 3A is a sectional view of the electronic device according to some embodiments of the present disclosure.

FIG. 3A is a sectional view of the electronic device 1000 according to some embodiments of the present disclosure.

Referring to FIG. 3A, the electronic device 1000 may include the display layer 100 and the sensor layer 200. The display layer 100 may include a base layer 110, a circuit layer 120, a light emitting element layer 130, and an encapsulation layer 140.

The base layer 110 may be a member that provides a surface on which the circuit layer 120 is located. The base layer 110 may be a glass substrate, a metal substrate, or a polymer substrate. However, without being limited thereto, the base layer 110 may be an inorganic layer, an organic layer, or a composite layer.

The base layer 110 may have a multi-layer structure. For example, the base layer 110 may include a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be referred to as a base barrier layer.

Each of the first and second synthetic resin layers may include a polyimide-based resin. Alternatively, each of the first and second synthetic resin layers may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, or a perylene-based resin. Meanwhile, a "~~"-based resin used herein may refer to a resin including a "~~" functional group.

The circuit layer 120 may be located on the base layer 110. The circuit layer 120 may include an insulating layer, a semiconductor pattern, a conductive pattern, and a signal line. The insulating layer, a semiconductor layer, and a conductive layer may be formed on the base layer 110 by a process such as coating or deposition and may be selectively subjected to patterning by performing a photolithography process a plurality of times. Thereafter, the semiconductor pattern, the conductive pattern, and the signal line included in the circuit layer 120 may be formed.

The light emitting element layer 130 may be located on the circuit layer 120. The light emitting element layer 130 may include light emitting elements. For example, the light emitting element layer 130 may include an organic light emitting material, quantum dots, quantum rods, a micro-LED, or a nano-LED.

The encapsulation layer 140 may be located on the light emitting element layer 130. The encapsulation layer 140 may protect the light emitting element layer 130 from foreign matter such as moisture, oxygen, and dust particles.

The sensor layer 200 may be formed on the display layer 100 through a continuous process. In this case, the sensor layer 200 may be expressed as being directly located on the display layer 100. When the sensor layer 200 is directly located on the display layer 100, it may mean that a third component is not located between the sensor layer 200 and the display layer 100. That is, a separate adhesive member may not be located between the sensor layer 200 and the display layer 100. Alternatively, the sensor layer 200 may be coupled with the display layer 100 through an adhesive member. The adhesive member may include a conventional adhesive or sticky substance.

Figure 3B:
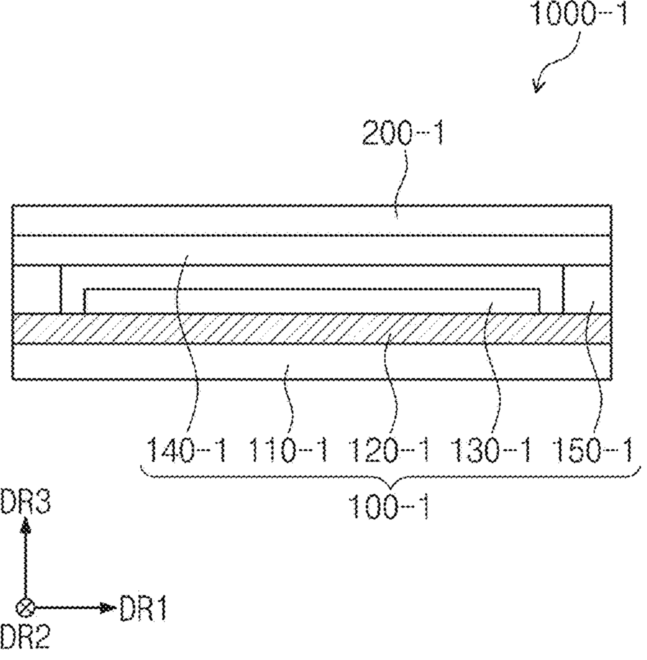
FIG. 3B is a sectional view of an electronic device according to some embodiments of the present disclosure.

FIG. 3B is a sectional view of an electronic device 1000-1 according to some embodiments of the present disclosure.

Referring to FIG. 3B, the electronic device 1000-1 may include a display layer 100-1 and a sensor layer 200-1. The display layer 100-1 may include a base substrate 110-1, a circuit layer 120-1, a light emitting element layer 130-1, an encapsulation substrate 140-1, and a coupling member 150-1.

Each of the base substrate 110-1 and the encapsulation substrate 140-1 may be a glass substrate, a metal substrate, or a polymer substrate, but is not particularly limited thereto.

The coupling member 150-1 may be located between the base substrate 110-1 and the encapsulation substrate 140-1. The coupling member 150-1 may couple the encapsulation substrate 140-1 to the base substrate 110-1 or the circuit layer 120-1. The coupling member 150-1 may include an inorganic material or an organic material. For example, the inorganic material may include a frit seal, and the organic material may include a photo-curable resin or a photo-plastic resin. However, the material of the coupling member 150-1 is not limited to the example.

The sensor layer 200-1 may be directly located on the encapsulation substrate 140-1. When the sensor layer 200-1 is directly located on the encapsulation substrate 140-1, it may mean that a third component is not located between the sensor layer 200-1 and the encapsulation substrate 140-1. That is, a separate adhesive member may not be located between the sensor layer 200-1 and the encapsulation substrate 140-1. However, without being limited thereto, an adhesive layer may be additionally located between the sensor layer 200-1 and the encapsulation substrate 140-1.

Figure 4:
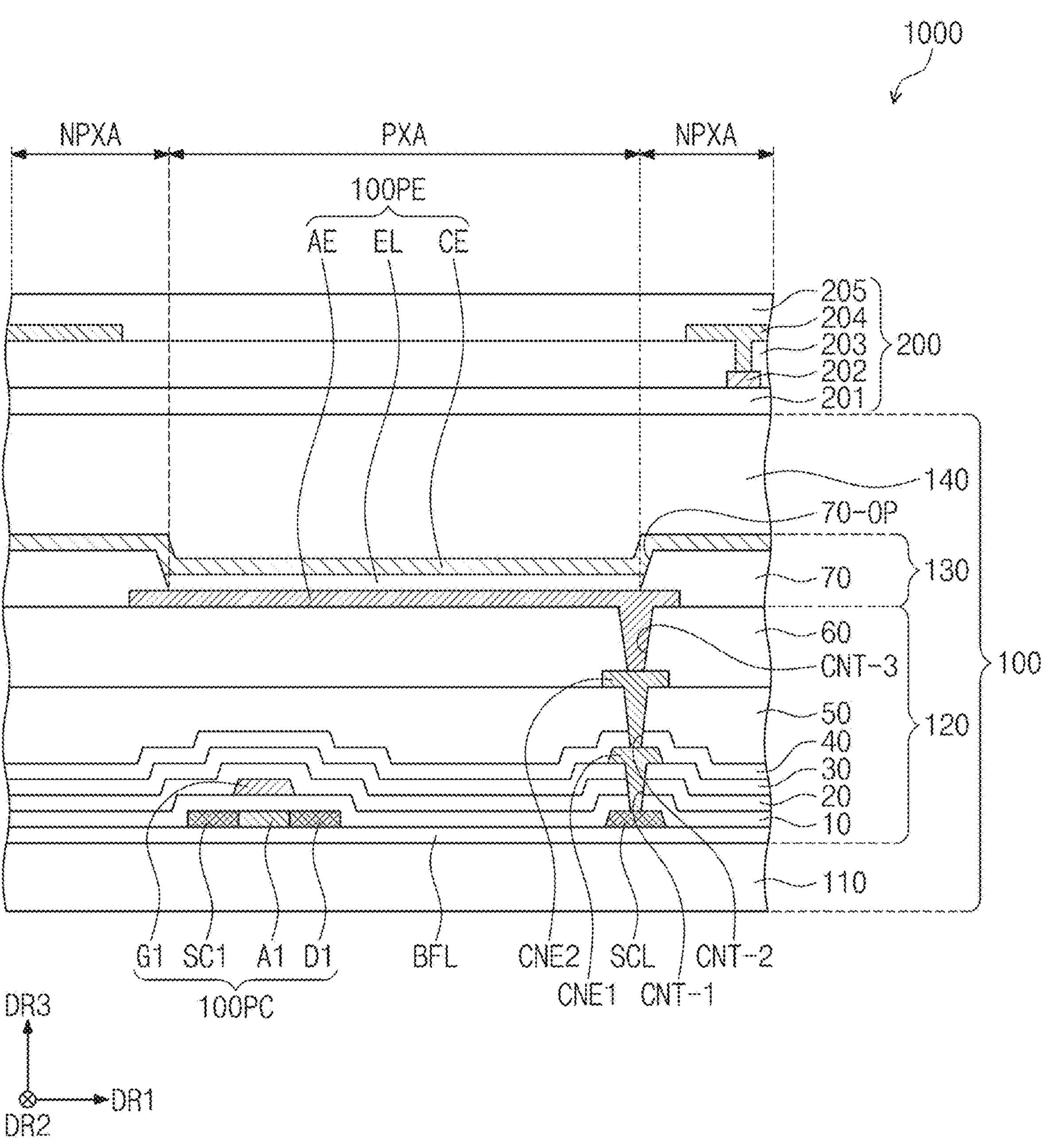
FIG. 4 is a sectional view of the electronic device illustrated in FIG. 3A according to some embodiments of the present disclosure.

FIG. 4 is a sectional view of the electronic device 1000 according to some embodiments of the present disclosure. In describing FIG. 4, the components described with reference to FIG. 3A will be assigned with identical reference numerals, and descriptions thereabout will be omitted.

Referring to FIG. 4, at least one inorganic layer may be formed on an upper surface of the base layer 110. The inorganic layer may include at least one of aluminum oxide, titanium oxide, silicon oxide, silicon oxy-nitride, zirconium oxide, or hafnium oxide. The inorganic layer may be formed in multiple layers. The multiple inorganic layers may constitute a barrier layer and/or a buffer layer. According to some embodiments, the display layer 100 is illustrated as including a buffer layer BFL.

The buffer layer BFL may relatively improve a coupling force between the base layer 110 and a semiconductor pattern. The buffer layer BFL may include silicon oxide layers and silicon nitride layers, and the silicon oxide layers and the silicon nitride layers may be alternately stacked one above another.

The semiconductor pattern may be located on the buffer layer BFL. The semiconductor pattern may include polysilicon. However, without being limited thereto, the semiconductor pattern may include amorphous silicon, low-temperature polycrystalline silicon, or oxide semiconductor.

FIG. 4 illustrates only a part of semiconductor patterns, and semiconductor patterns may be additionally located in other regions. The semiconductor patterns may be arranged across pixels according to a specific rule. The semiconductor pattern may have different electrical properties depending on whether the semiconductor pattern is doped or not. The semiconductor pattern may include a first region having a high conductivity and a second region having a low conductivity. The first region may be doped with an N-type dopant or a P-type dopant. A P-type transistor may include a doped region doped with a P-type dopant, and an N-type transistor may include a doped region doped with an N-type dopant. The second region may be an undoped region, or may be a region more lightly doped than the first region.

The first region may have a higher conductivity than the second region and may substantially serve as an electrode or a signal line. The second region may substantially correspond to an active (or, channel) region of a transistor. In other words, a portion of the semiconductor pattern may be the active region of the transistor, another portion may be a source or drain of the transistor, and another portion may be a connecting electrode or a connecting signal line.

Each of the pixels may have an equivalent circuit including seven transistors, one capacitor, and a light emitting element, and the equivalent circuit of the pixel may be modified in various forms. In FIG. 4, one transistor 100PC and a light emitting element 100PE included in the pixel are illustrated.

The transistor 100PC may include a source SC1, an active region A1, a drain D1, and a gate G1. The source SC1, the active region A1, and the drain D1 may be formed from the semiconductor pattern. The source SC1 and the drain D1 may extend from the active region A1 in opposite directions on the section. In FIG. 4, a portion of a connecting signal line SCL formed from the semiconductor pattern is illustrated. Although not separately illustrated, the connecting signal line SCL may be electrically connected to the drain D1 of the transistor 100PC on the plane.

A first insulating layer 10 may be located on the buffer layer BFL. The first insulating layer 10 may commonly overlap a plurality of pixels and may cover the semiconductor pattern. The first insulating layer 10 may be an inorganic layer and/or an organic layer and may have a single-layer structure or a multi-layer structure. The first insulating layer 10 may include at least one of aluminum oxide, titanium oxide, silicon oxide, silicon nitride, silicon oxy-nitride, zirconium oxide, or hafnium oxide. According to some embodiments, the first insulating layer 10 may be a single silicon oxide layer. Not only the first insulating layer 10 but also insulating layers of the circuit layer 120 to be described below may be inorganic layers and/or organic layers and may have a single-layer structure or a multi-layer structure. The inorganic layers may include at least one of the aforementioned materials, but embodiments according to the present disclosure are not limited thereto.

The gate G1 is located on the first insulating layer 10. The gate G1 may be a portion of a metal pattern. The gate G1 overlaps the active region A1. The gate G1 may function as a mask in a process of doping the semiconductor pattern.

A second insulating layer 20 may be located on the first insulating layer 10 and may cover the gate G1. The second insulating layer 20 may commonly overlap the pixels. The second insulating layer 20 may be an inorganic layer and/or an organic layer and may have a single-layer structure or a multi-layer structure. The second insulating layer 20 may include at least one of silicon oxide, silicon nitride, or silicon oxy-nitride. According to some embodiments, the second insulating layer 20 may have a multi-layer structure including a silicon oxide layer and a silicon nitride layer.

A third insulating layer 30 may be located on the second insulating layer 20. The third insulating layer 30 may have a single-layer structure or a multi-layer structure. For example, the third insulating layer 30 may have a multi-layer structure including a silicon oxide layer and a silicon nitride layer.

A first connecting electrode CNE1 may be located on the third insulating layer 30. The first connecting electrode CNE1 may be connected to the connecting signal line SCL through a contact hole CNT-1 penetrating the first, second, and third insulating layers 10, 20, and 30.

A fourth insulating layer 40 may be located on the third insulating layer 30. The fourth insulating layer 40 may be a single silicon oxide layer. A fifth insulating layer 50 may be located on the fourth insulating layer 40. The fifth insulating layer 50 may be an organic layer.

A second connecting electrode CNE2 may be located on the fifth insulating layer 50. The second connecting electrode CNE2 may be connected to the first connecting electrode CNE1 through a contact hole CNT-2 penetrating the fourth insulating layer 40 and the fifth insulating layer 50.

A sixth insulating layer 60 may be located on the fifth insulating layer 50 and may cover the second connecting electrode CNE2. The sixth insulating layer 60 may be an organic layer.

The light emitting element layer 130 may be located on the circuit layer 120. The light emitting element layer 130 may include the light emitting element 100PE. For example, the light emitting element layer 130 may include an organic light emitting material, quantum dots, quantum rods, a micro-LED, or a nano-LED. Hereinafter, it will be described that the light emitting element 100PE is an organic light emitting element. However, embodiments according to the present disclosure are not particularly limited thereto.

The light emitting element 100PE may include a first electrode AE, an emissive layer EL, and a second electrode CE. The first electrode AE may be located on the sixth insulating layer 60. The first electrode AE may be connected to the second connecting electrode CNE2 through a contact hole CNT-3 penetrating the sixth insulating layer 60.

A pixel defining film 70 may be located on the sixth insulating layer 60 and may cover a portion of the first electrode AE. The pixel defining film 70 may have an opening 70-OP defined therein. The opening 70-OP of the pixel defining film 70 exposes at least a portion of the first electrode AE.

The active region 1000A (refer to FIG. 1A) may include an emissive region PXA and a non-emissive region NPXA adjacent to the emissive region PXA. The non-emissive region NPXA may surround the emissive region PXA. According to some embodiments, the emissive region PXA is defined to correspond to a partial region of the first electrode AE exposed through the opening 70-OP.

The emissive layer EL may be located on the first electrode AE. The emissive layer EL may be located in a region corresponding to the opening 70-OP. That is, the emissive layer EL may be separately formed for each of the pixels. When the emissive layer EL is separately formed for each of the pixels, the emissive layers EL may each emit at least one of blue light, red light, or green light. However, without being limited thereto, the emissive layer EL may be connected to the pixels and may be commonly provided. In this case, the emissive layer EL may provide blue light or white light.

The second electrode CE may be located on the emissive layer EL. The second electrode CE may have an integral shape and may be commonly arranged for the plurality of pixels.

According to some embodiments, a hole control layer may be located between the first electrode AE and the emissive layer EL. The hole control layer may be commonly arranged in the emissive region PXA and the non-emissive region NPXA. The hole control layer may include a hole transporting layer and may further include a hole injection layer. An electron control layer may be located between the emissive layer EL and the second electrode CE. The electron control layer may include an electron transporting layer and may further include an electron injection layer. The hole control layer and the electron control layer may be commonly formed for the plurality of pixels by using an open mask.

The encapsulation layer 140 may be located on the light emitting element layer 130. The encapsulation layer 140 may include an inorganic layer, an organic layer, and an inorganic layer sequentially stacked one above another. However, layers constituting the encapsulation layer 140 are not limited thereto.

The inorganic layers may protect the light emitting element layer 130 from moisture and oxygen, and the organic layer may protect the light emitting element layer 130 from foreign matter such as dust particles. The inorganic layers may include a silicon nitride layer, a silicon oxy-nitride layer, a silicon oxide layer, a titanium oxide layer, or an aluminum oxide layer. The organic layer may include, but is not limited to, an acrylate-based organic layer.

The sensor layer 200 may be formed on the display layer 100 through a continuous process. In this case, the sensor layer 200 may be expressed as being directly located on the display layer 100. When the sensor layer 200 is directly located on the display layer 100, it may mean that a third component is not located between the sensor layer 200 and the display layer 100. That is, a separate adhesive member may not be located between the sensor layer 200 and the display layer 100. Alternatively, the sensor layer 200 may be coupled to the display layer 100 through an adhesive member. The adhesive member may include a conventional adhesive or sticky substance.

The sensor layer 200 may include a base insulating layer 201, a first conductive layer 202, a detection insulating layer 203, a second conductive layer 204, and a cover insulating layer 205.

The base insulating layer 201 may be an inorganic layer including at least one of silicon nitride, silicon oxy-nitride, or silicon oxide. Alternatively, the base insulating layer 201 may be an organic layer including an epoxy resin, an acrylic resin, or an imide-based resin. The base insulating layer 201 may have a single-layer structure, or may have a multi-layer structure stacked in the third direction DR3.

Each of the first conductive layer 202 and the second conductive layer 204 may have a single-layer structure, or may have a multi-layer structure stacked in the third direction DR3.

The conductive layer having the single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), or indium zinc tin oxide (IZTO). In addition, the transparent conductive layer may include a conductive polymer such as PEDOT, a metal nano wire, or graphene.

The conductive layer having the multi-layer structure may include metal layers. The meal layers may have, for example, a three-layer structure of titanium/aluminum/titanium. The conductive layer having the multi-layer structure may include at least one metal layer and at least one transparent conductive layer.

At least one of the detection insulating layer 203 or the cover insulating layer 205 may include an inorganic film. The inorganic film may include at least one of aluminum oxide, titanium oxide, silicon oxide, silicon nitride, silicon oxy-nitride, zirconium oxide, or hafnium oxide.

At least one of the detection insulating layer 203 or the cover insulating layer 205 may include an organic film. The organic film may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyimide-based resin, a polyamide-based resin, or a perylene-based resin.

FIG. 5 is a block diagram of the display layer and the display driver according to some embodiments of the present disclosure.

Referring to FIG. 5, the display layer 100 may include a plurality of scan lines SL1 to SLn, a plurality of data lines DL1 to DLm, and a plurality of pixels PX. Each of the plurality of pixels PX may be connected with a corresponding data line among the plurality of data lines DL1 to DLm and may be connected with a corresponding scan line among the plurality of scan lines SL1 to SLn. According to some embodiments of the present disclosure, the display layer 100 may further include light emission control lines, and the display driver 100C may further include a light emission drive circuit that provides control signals to the light emission control lines. The configuration of the display layer 100 is not particularly limited.

The display driver 100C may include a signal control circuit 100C1, a scan drive circuit 100C2, and a data drive circuit 100C3.

The signal control circuit 100C1 may receive the image data RGB and the control signal D-CS from the main controller 1000C (refer to FIG. 2). The control signal D-CS may include various signals. For example, the control signal D-CS may include the input vertical synchronization signal, the input horizontal synchronization signal, the main clock, and the data enable signal.

The signal control circuit 100C1 may generate a first control signal CONT1 and a vertical synchronization signal Vsync based on the control signal D-CS and may output the first control signal CONT1 and the vertical synchronization signal Vsync to the scan drive circuit 100C2. The vertical synchronization signal Vsync may be included in the first control signal CONT1.

The signal control circuit 100C1 may generate a second control signal CONT2 and a horizontal synchronization signal Hsync based on the control signal D-CS and may output the second control signal CONT2 and the horizontal synchronization signal Hsync to the data drive circuit 100C3. The horizontal synchronization signal Hsync may be included in the second control signal CONT2.

Furthermore, the signal control circuit 100C1 may output, to the data drive circuit 100C3, a data signal DS obtained by processing the image data RGB according to an operating condition of the display layer 100. The first control signal CONT1 and the second control signal CONT2 are signals required for operations of the scan drive circuit 100C2 and the data drive circuit 100C3 and are not particularly limited.

The scan drive circuit 100C2 may drive the plurality of scan lines SL1 to SLn in response to the first control signal CONT1 and the vertical synchronization signal Vsync. According to some embodiments of the present disclosure, the scan drive circuit 100C2 may be formed through the same process as the circuit layer 120 (refer to FIG. 3A) in the display layer 100, but is not limited thereto. For example, the scan drive circuit 100C2 may be implemented with an integrated circuit (IC) and may be directly mounted on a region (e.g., a set or predetermined region) of the display layer 100, or may be mounted on a separate printed circuit board in a chip on film (COF) manner and may be electrically connected with the display layer 100.

In response to the second control signal CONT2, the horizontal synchronization signal Hsync, and the data signal DS from the signal control circuit 100C1, the data drive circuit 100C3 may output gray voltages for driving the plurality of data lines DL1 to DLm. The data drive circuit 100C3 may be implemented with an integrated circuit and may be directly mounted on a region (e.g., a set or predetermined region) of the display layer 100, or may be mounted on a separate printed circuit board in a chip on film (COF) manner and may be electrically connected with the display layer 100. However, the data drive circuit 100C3 is not particularly limited. For example, the data drive circuit 100C3 may be formed through the same process as the circuit layer 120 (refer to FIG. 5) in the display layer 100.

Figure 6:
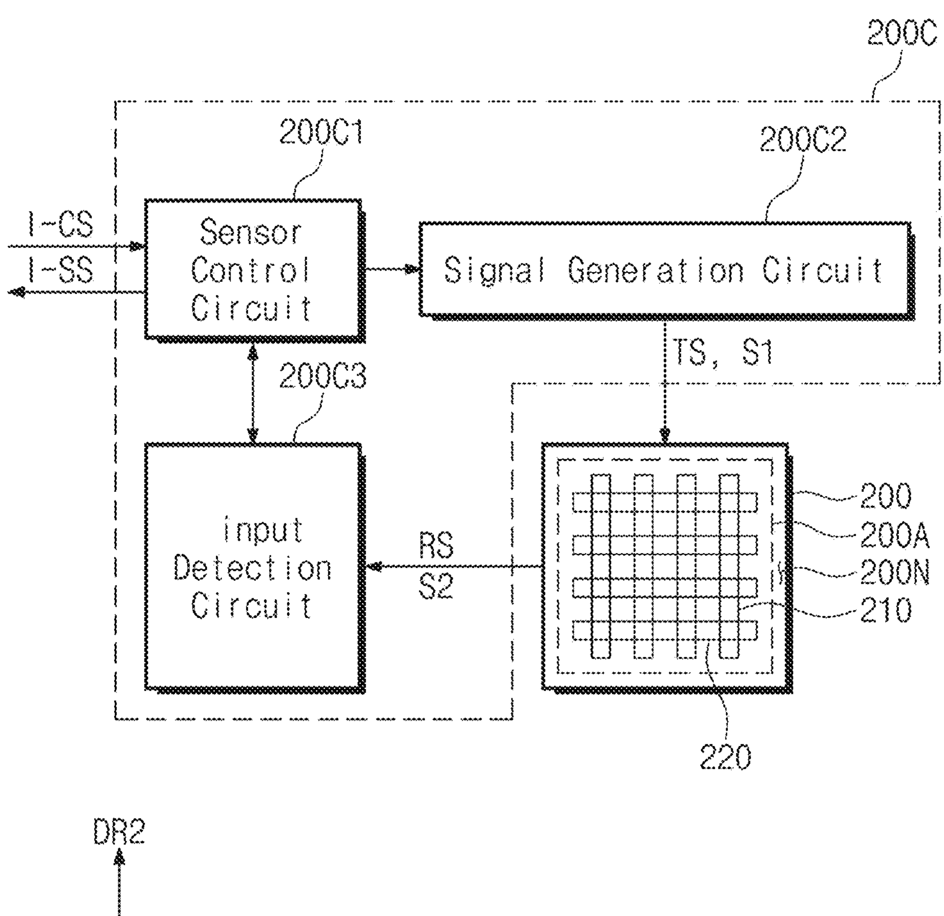
FIG. 6 is a block diagram of a sensor layer and a controller according to some embodiments of the present disclosure.

FIG. 6 is a block diagram of the sensor layer and the controller according to some embodiments of the present disclosure.

Referring to FIG. 6, an active region 200A and a peripheral region 200NA may be defined in the sensor layer 200. The active region 200A may be a region activated in response to an electrical signal. For example, the active region 200A may be a region that detects an input.

The sensor layer 200 may include a plurality of first electrodes 210 and a plurality of second electrodes 220.

The plurality of first electrodes 210 may extend in the second direction DR2. The plurality of first electrodes 210 may be arranged in the first direction DR1 so as to be spaced apart from each other. The plurality of second electrodes 220 may extend in the first direction DR1. The plurality of second electrodes 220 may be arranged in the second direction DR2 so as to be spaced apart from each other. The plurality of first electrodes 210 and the plurality of second electrodes 220 may insulatively intersect each other. As used herein, the term "insulatively intersect" in describing the structural characteristics between two components mean that the two components intersect each other (or cross over each other) in a plan view (e.g., a view perpendicular or normal with respect to a display surface). For example, the first electrodes 210 extend in the second direction DR2 and the second electrodes 220 extend in the first direction DR1 and cross or intersect each other in a plan view without being electrically connected to each other at the intersection. That is, each first electrode 210 is insulated from each second electrode 220 that crosses or intersects (in a plan view) the corresponding first electrode 210.

The controller 200C may be electrically connected to the sensor layer 200. The controller 200C may control the sensor layer 200. The controller 200C may receive the control signal I-CS from the main controller 1000C (refer to FIG. 2) and may provide the coordinate signal I-SS to the main controller 1000C (refer to FIG. 2).

The controller 200C may control the first mode for detecting whether the sensor layer 200 is defective and the second mode for detecting an input by a touch.

The controller 200C may include a sensor control circuit 200C1, a signal generation circuit 200C2, and an input detection circuit 200C3. The sensor control circuit 200C1, the signal generation circuit 200C2, and the input detection circuit 200C3 may be implemented within a single chip, and a part of the sensor control circuit 200C1, the signal generation circuit 200C2, and the input detection circuit 200C3 and the other parts may be implemented within different chips.

In the first mode, the sensor control circuit 200C1 may control an operation of the signal generation circuit 200C2 and may determine whether the sensor layer 200 is defective, based on a signal received from the input detection circuit 200C3.

The signal generation circuit 200C2 may provide a test signal TS to the sensor layer 200. The test signal TS may have a test frequency higher than a touch drive frequency.

The input detection circuit 200C3 may receive a detection signal RS from the sensor layer 200. The input detection circuit 200C3 may amplify and filter the received analog signal. Thereafter, the input detection circuit 200C3 may convert the filtered signal into a digital signal.

The sensor control circuit 200C1 may detect whether the sensor layer 200 is defective, based on the detection signal RS reflecting a change in first capacitance between the plurality of first electrodes 210 and the plurality of second electrodes 220.

In the second mode, the sensor control circuit 200C1 may operate the sensor layer 200 at the touch drive frequency. The touch drive frequency may be lower than the test frequency. The sensor control circuit 200C1 may control an operation of the signal generation circuit 200C2 and may calculate the coordinates of an external input from a signal received from the input detection circuit 200C3.

The signal generation circuit 200C2 may provide a first touch signal S1 to the sensor layer 200. The first touch signal S1 may have the touch drive frequency. The touch drive frequency may be equal to or higher than the drive frequency of the display layer 100.

The input detection circuit 200C3 may receive the second touch signal S2 from the sensor layer 200. The input detection circuit 200C3 may amplify and filter the received analog signal. Thereafter, the input detection circuit 200C3 may convert the filtered signal into a digital signal.

The sensor control circuit 200C1 may calculate coordinate information by a touch of the user's body 2000 (refer to FIG. 2), based on the second touch signal S2 and may output the coordinate signal I-SS having the coordinate information.

The sensor control circuit 200C1 may detect the position of the user's body 2000, based on a second touch signal S2 reflecting a change in second capacitance between the plurality of first electrodes 210 and the plurality of second electrodes 220 due to the user's body 2000 (refer to FIG. 2). The change in the second capacitance may mean a change in capacitance that occurs after an input by an input means, for example, the user's body 2000 (refer to FIG. 2).

The first touch signal S1 and the test signal TS may be referred to as a TX signal, and the second touch signal S2 and the detection signal RS may be referred to as an RX signal.

Figure 7:
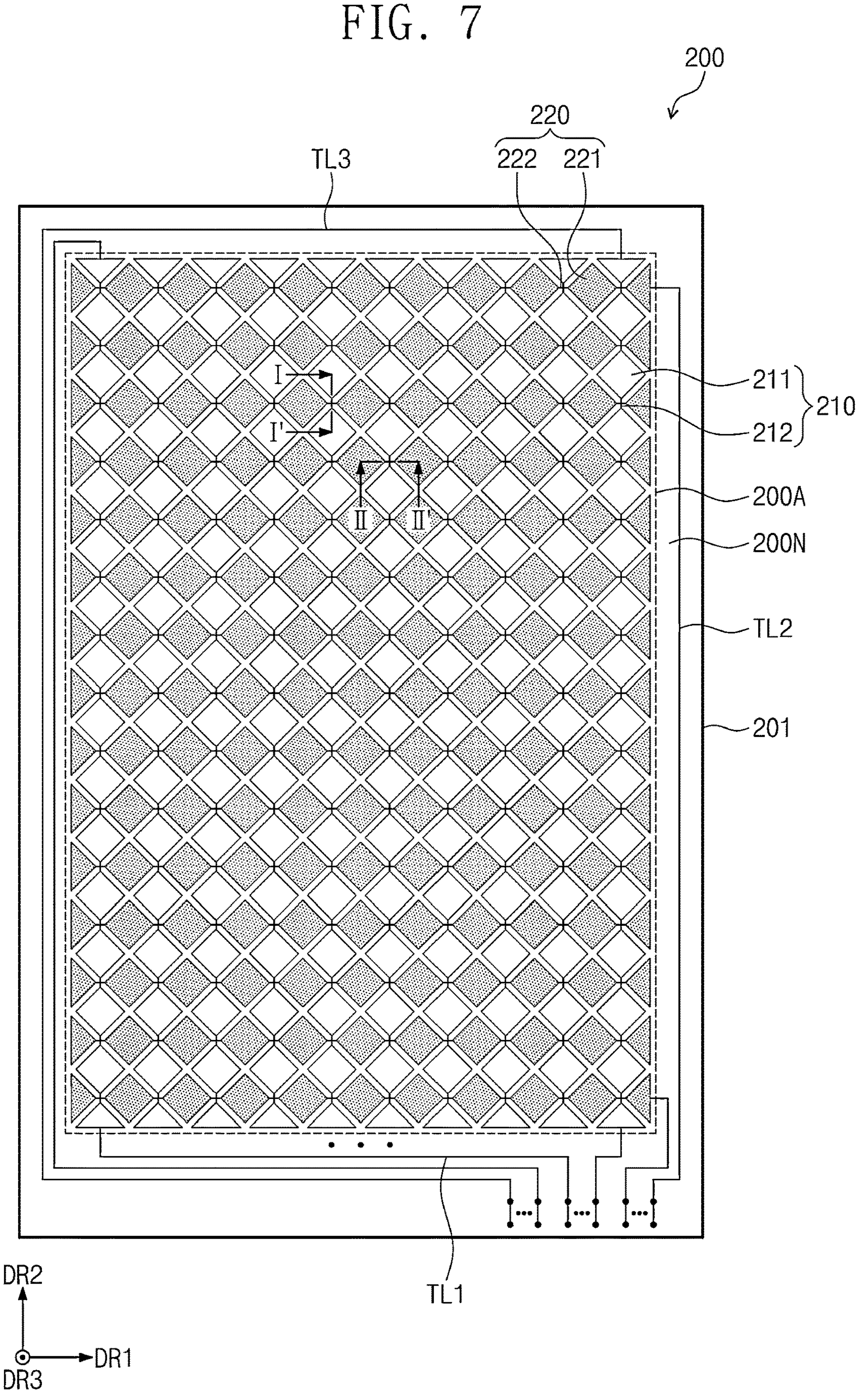
FIG. 7 is a plan view of the sensor layer according to some embodiments of the present disclosure.

FIG. 7 is a plan view of the sensor layer according to some embodiments of the present disclosure.

Referring to FIG. 7, the active region 200A and the peripheral region 200N surrounding the active region 200A may be defined in the sensor layer 200. The active region 200A may be a region activated in response to an electrical signal. For example, the active region 200A may be a region that detects an external input. The active region 200A may overlap the active region 1000A (refer to FIG. 1) of the electronic device 1000 (refer to FIG. 1) when viewed on the plane.

The sensor layer 200 may include the base insulating layer 201, the plurality of first electrodes 210, the plurality of second electrodes 220, and a plurality of detection lines TL1, TL2, and TL3. The plurality of first electrodes 210 and the plurality of second electrodes 220 may be located in the active region 200A, and the plurality of detection lines TL1, TL2, and TL3 may be located in the peripheral region 200N. In the second mode for detecting an input by the user's body 2000 (refer to FIG. 2), the sensor layer 200 may obtain information about an external input through a change in capacitance for the first touch signal S1 (refer to FIG. 6) having the touch drive frequency between the plurality of first electrodes 210 and the plurality of second electrodes 220. The touch drive frequency may range from 250 kilohertz (kHz) to 350 kHz. For example, the touch drive frequency may be 300 KHz.

The plurality of first electrodes 210 may extend in the second direction DR2. The plurality of first electrodes 210 may be arranged in the first direction DR1. Each of the plurality of first electrodes 210 may include a plurality of detection patterns 211 and a plurality of connecting patterns 212. Each of the plurality of connecting patterns 212 may electrically connect two detection patterns 211 adjacent to each other. The plurality of detection patterns 211 may have a mesh structure.

The plurality of second electrodes 220 may extend in the first direction DR1. The plurality of second electrodes 220 may be arranged in the second direction DR2. Each of the plurality of second electrodes 220 may include a plurality of first portions 221 and a plurality of second portions 222. Each of the plurality of second portions 222 may electrically connect two first portions 221 adjacent to each other. The plurality of first portions 221 and the plurality of second portions 222 may have a mesh structure.

Although FIG. 7 illustrates one example that one connecting pattern 212 is connected to two detection patterns 211 adjacent to each other, a connection relationship between the plurality of connecting patterns 212 and the plurality of detection patterns 211 according to some embodiments of the present disclosure is not limited thereto. For example, two detection patterns 211 adjacent to each other may be connected by two connecting patterns 212.

The plurality of second portions 222 may be located in a different layer from the plurality of connecting patterns 212. The plurality of connecting patterns 212 may insulatively intersect the plurality of second electrodes 220. For example, the plurality of second portions 222 may insulatively intersect the plurality of connecting patterns 212, respectively.

The first conductive layer 202 (refer to FIG. 4) may include the plurality of connecting patterns 212, and the second conductive layer 204 (refer to FIG. 2) may include the plurality of second electrodes 220 and the plurality of detection patterns 211.

The plurality of detection lines TL1, TL2, and TL3 may include a plurality of first detection lines TL1, a plurality of second detection lines TL2, and a plurality of third detection lines TL3.

The plurality of first detection lines TL1 may be connected to first ends of the plurality of first electrodes 210, respectively. The plurality of second detection lines TL2 may be connected to the plurality of second electrodes 220, respectively. The plurality of third detection lines TL3 may be connected to second ends of the plurality of first electrodes 210, respectively. The second ends of the plurality of first electrodes 210 may be portions facing away from the first ends of the plurality of first electrodes 210.

One first electrode 210 according to some embodiments of the present disclosure may be connected to the first detection line TL1 and the third detection line TL3. Accordingly, sensitivities depending on regions may be uniformly maintained for the first electrode 210 longer than the second electrode 220. However, this is illustrative. The third detection lines TL3 according to some embodiments of the present disclosure may be omitted, and embodiments according to the present disclosure is not limited thereto.

Figure 8A:
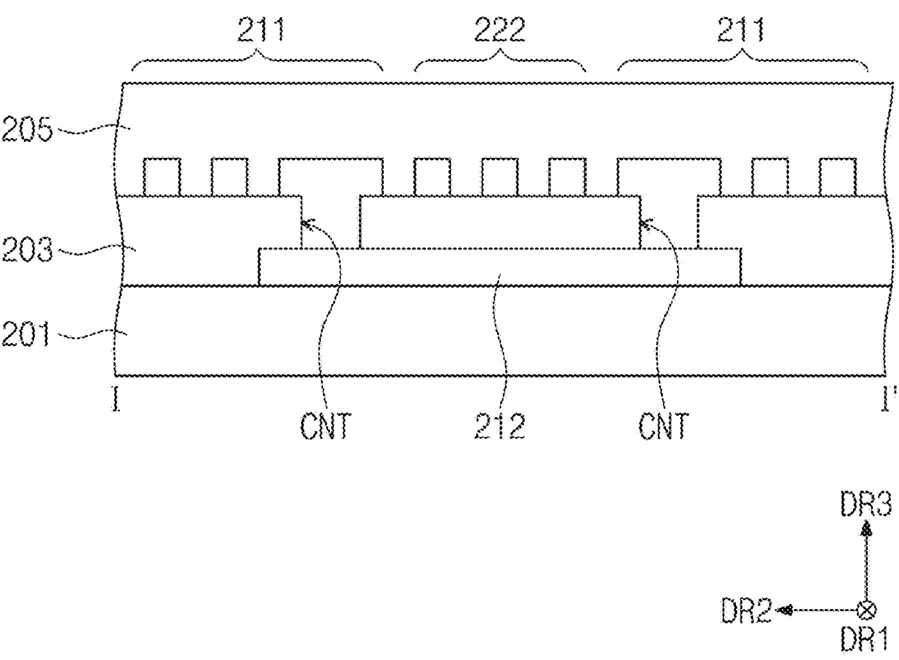
FIG. 8A is a sectional view taken along the line I-I' of FIG. 7 according to some embodiments of the present disclosure.

FIG. 8A is a sectional view taken along the line I-I' of FIG. 7 according to some embodiments of the present disclosure. In describing FIG. 8A, the components described with reference to FIG. 4 will be assigned with identical reference numerals, and descriptions thereabout will be omitted.

Referring to FIGS. 7 and 8A, the plurality of connecting patterns 212 may be located on the base insulating layer 201. The detection insulating layer 203 may be located on the plurality of connecting patterns 212. The detection insulating layer 203 may have a single-layer structure or a multi-layer structure. The detection insulating layer 203 may include an inorganic material, an organic material, or a composite material.

The plurality of detection patterns 211, the plurality of first portions 221, and the plurality of second portions 222 may be located on the detection insulating layer 203. The plurality of detection patterns 211, the plurality of first portions 221, and the plurality of second portions 222 may have a mesh structure.

A plurality of contact holes CNT may be formed through the detection insulating layer 203 in the third direction DR3. Among the plurality of detection patterns 211, two detection patterns 211 adjacent to each other may be electrically connected with the connecting pattern 212 through the plurality of contact holes CNT.

The cover insulating layer 205 may be located on the plurality of detection patterns 211, the plurality of first portions 221, and the plurality of second portions 222. The cover insulating layer 205 may have a single-layer structure or a multi-layer structure. The cover insulating layer 205 may include an inorganic material, an organic material, or a composite material.

Although FIG. 8A illustrates a bottom connection structure in which the plurality of connecting patterns 212 are located below the plurality of detection patterns 211, the plurality of first portions 221, and the plurality of second portions 222, the present disclosure is not limited thereto. For example, the sensor layer 200 may have a top connection structure in which the plurality of connecting patterns 212 are located above the plurality of detection patterns 211, the plurality of first portions 221, and the plurality of second portions 222.

Figure 8B:
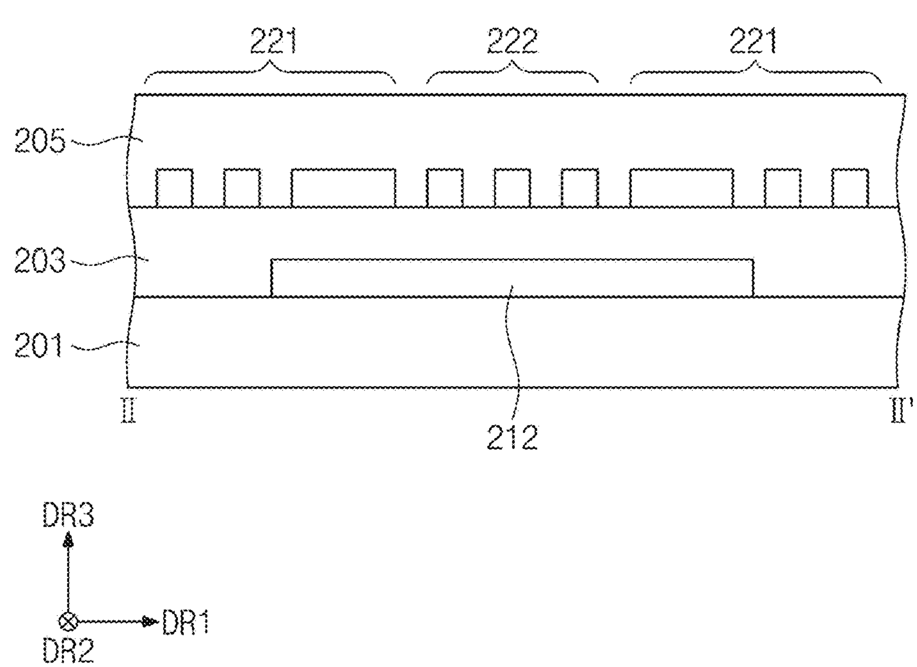
FIG. 8B is a sectional view taken along the line II-II' of FIG. 7 according to some embodiments of the present disclosure.

FIG. 8B is a sectional view taken along the line II-II' of FIG. 7 according to some embodiments of the present disclosure. In describing FIG. 8B, the components described with reference to FIGS. 7 and 8A will be assigned with identical reference numerals, and descriptions thereabout will be omitted.

Referring to FIG. 8B, the plurality of first portions 221 and the plurality of second portions 222 may be located above the plurality of connecting patterns 212. Each of the plurality of second portions 222 may connect two first portions 221 adjacent to each other. The plurality of first portions 221 and the plurality of second portions 222 may have a mesh structure.

Figure 9:
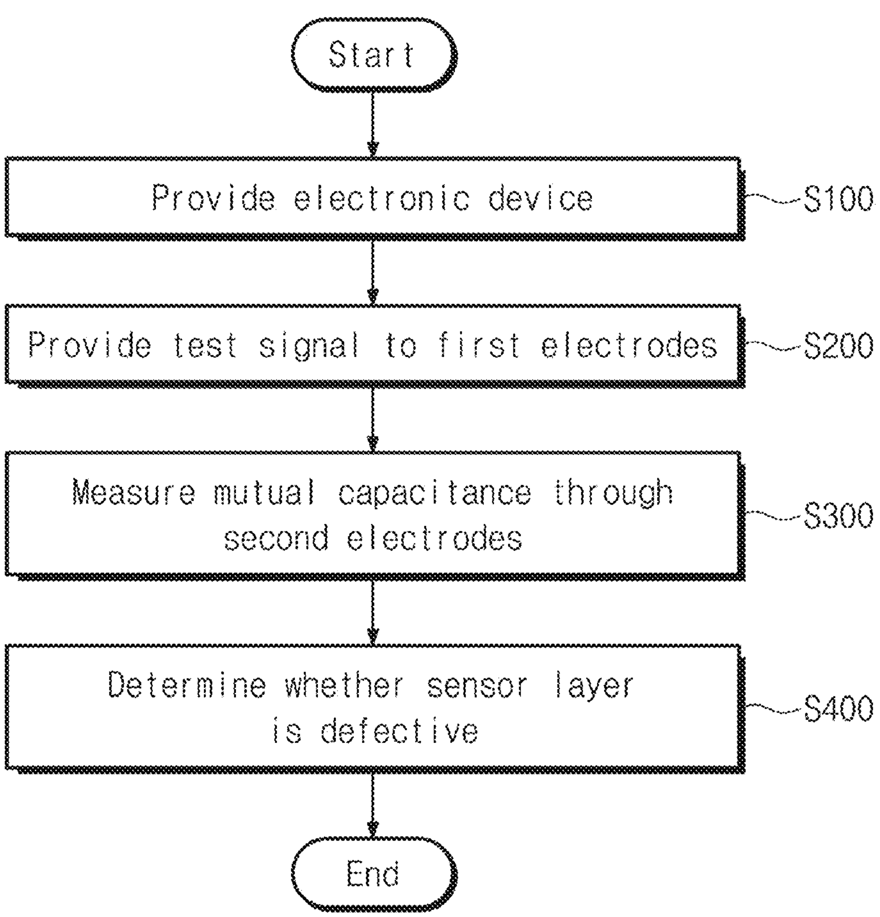
FIG. 9 is a flowchart illustrating an electronic device testing method according to some embodiments of the present disclosure.

FIG. 9 is a flowchart illustrating an electronic device testing method according to some embodiments of the present disclosure.

Referring to FIGS. 6 and 9, the electronic device 1000 (refer to FIG. 1) for testing the sensor layer 200 may be provided to the user (S100). The user may control the controller 200C.

The signal generation circuit 200C2 may provide the test signal TS to the plurality of first electrodes 210 (S200).

The input detection circuit 200C3 may measure mutual capacitance with the plurality of first electrodes 210 through the plurality of second electrodes 220 (S300).

The sensor control circuit 200C1 may determine whether the sensor layer 200 is defective, based on the mutual capacitance (S400).

Figure 10:
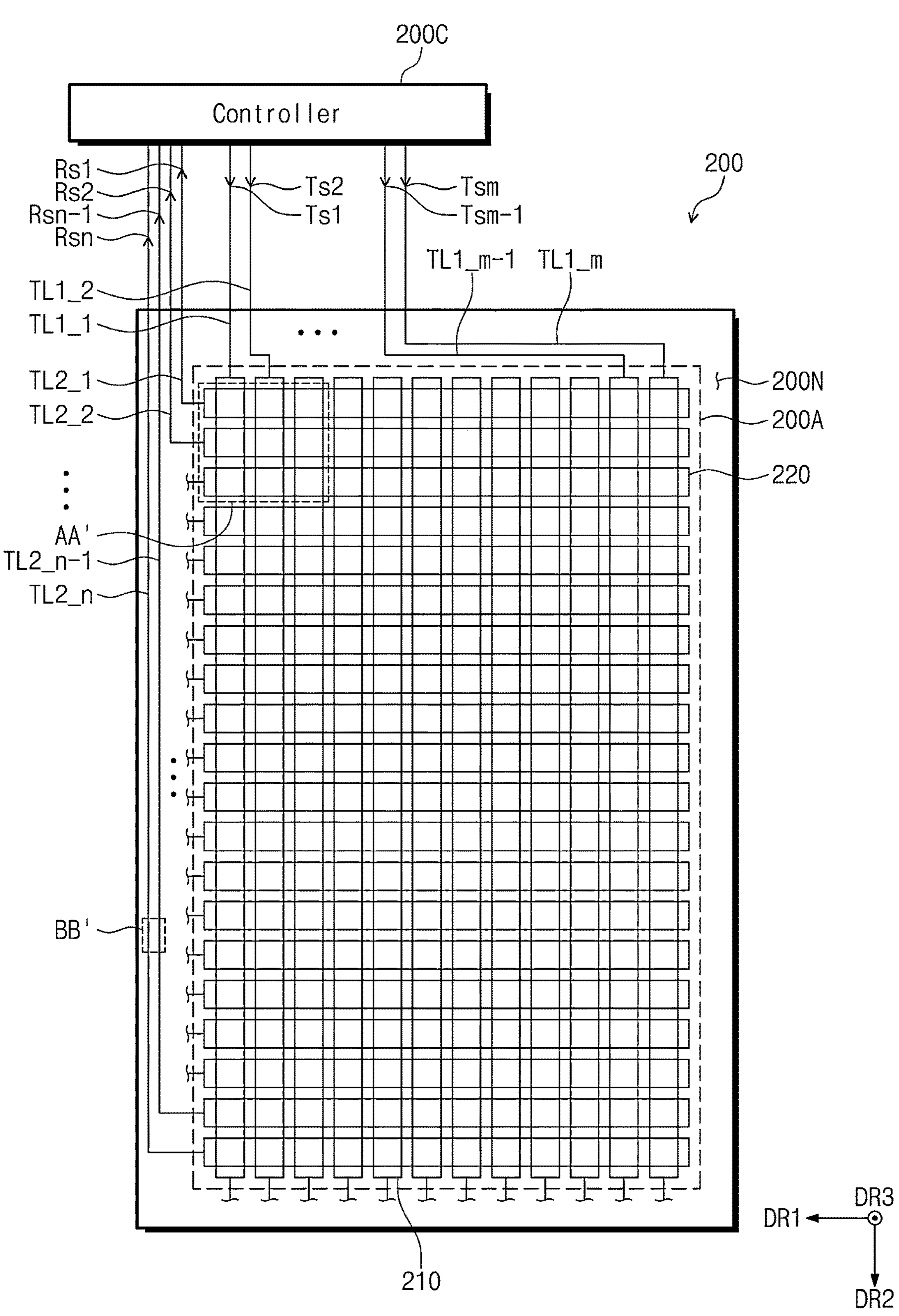
FIG. 10 is a conceptual diagram illustrating the sensor layer according to some embodiments of the present disclosure.

FIG. 10 is a conceptual diagram illustrating the sensor layer according to some embodiments of the present disclosure. In describing FIG. 10, the components described with reference to FIG. 7 will be assigned with identical reference numerals, and descriptions thereabout will be omitted.

Referring to FIG. 10, the sensor layer 200 may include the plurality of first electrodes 210, the plurality of second electrodes 220, a plurality of first detection lines TL1_1 to TL1_*m* and a plurality of second detection lines TL2_1 to TL2_*n*.

The plurality of first detection lines TL1_1 to TL1_*m* may be electrically connected to first sides of the plurality of first electrodes 210, respectively. The plurality of second detection lines TL2_1 to TL2_*n* may be electrically connected to first sides of the plurality of second electrodes 220, respectively. However, embodiments according to the present disclosure are not limited thereto. For example, the sensor layer 200 according to some embodiments of the present disclosure may further include a plurality of third lines electrically connected to second sides of the plurality of first electrodes 210, respectively.

The controller 200C may be electrically connected with the sensor layer 200. The controller 200C may be electrically connected with the plurality of first electrodes 210 and the plurality of second electrodes 220. The controller 200C may control the first mode for determining whether the sensor layer 200 is defective and the second mode for detecting an input by a touch.

In the first mode, the controller 200C may determine whether the sensor layer 200 is defective, based on a plurality of detection signals Rs1 to Rsn reflecting a change in first capacitance between the plurality of first electrodes 210 and the plurality of second electrodes 220.

The plurality of first electrodes 210 may be electrically connected to the controller 200C through the plurality of first detection lines TL1_1 to TL1_*m*, and the plurality of second electrodes 220 may be electrically connected to the controller 200C through the plurality of second detection lines TL2_1 to TL2_*n*.

The controller 200C may transmit a plurality of test signals Ts1 to Tsm to the plurality of first electrodes 210 and may receive the plurality of detection signals Rs1 to Rsn reflecting the first capacitance between the plurality of first electrodes 210 and the plurality of second electrodes 220 from the plurality of second electrodes 220.

The plurality of test signals Ts1 to Tsm may correspond to the test signal TS of FIG. 6 (refer to FIG. 6), and the plurality of detection signals Rs1 to Rsn may correspond to the detection signal RS of FIG. 6 (refer to FIG. 6).

The controller 200C may determine whether or not the plurality of first electrodes 210, the plurality of second electrodes 220, the plurality of first detection lines TL1_1 to TL1_*m*, or the plurality of second detection lines TL2_1 to TL2_*n* are defective, by comparing the measured first mutual capacitance with another mutual capacitance measured by an adjacent electrode. Description thereabout will be given below.

Figure 11:
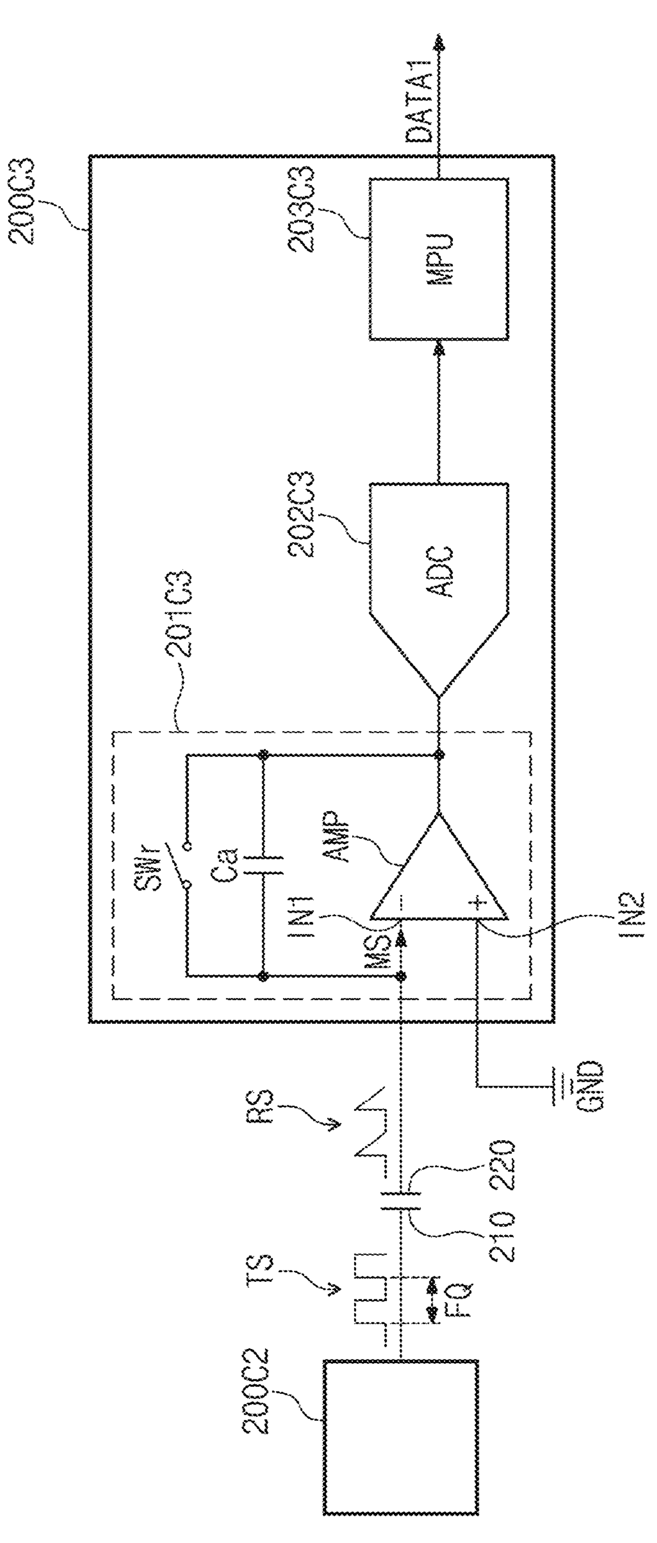
FIG. 11 illustrates operations of the sensor layer and the controller in a first mode according to some embodiments of the present disclosure.

FIG. 11 illustrates operations of the sensor layer and the controller in the first mode according to some embodiments of the present disclosure.

Referring to FIG. 11, the plurality of first electrodes 210 may form capacitances with the plurality of second electrodes 220, respectively.

The plurality of first electrodes 210 may be electrically connected to the signal generation circuit 200C2. The plurality of second electrodes 220 may be electrically connected to the input detection circuit 200C3. In FIG. 11, one first electrode 210 among the plurality of first electrodes 210 and one second electrode 220 among the plurality of second electrodes 220 are illustrated as an example.

The signal generation circuit 200C2 may provide the test signal TS to the first electrode 210. The test signal TS may have a test frequency FQ. The test frequency FQ may be higher than the touch drive frequency of the sensor layer 200. The test frequency FQ may range from 400 kilohertz (kHz) to 1 megahertz (MHz).

The detection signal RS corresponding to the test signal TS may be output from the second electrode 220. The detection signal RS may be input to the input detection circuit 200C3. The input detection circuit 200C3 may amplify, convert, and process the detection signal RS input from the second electrode 220 and may output mutual capacitance according to the result.

The input detection circuit 200C3 may include a signal receiving unit 201C3, a conversion circuit 202C3, and a signal processing unit 203C3.

The signal receiving unit 201C3 may obtain a measurement signal MS from the second electrode 220. The measurement signal MS may include the detection signal RS. That is, the signal receiving unit 201C3 may receive the measurement signal MS from each second electrode 220. The signal receiving unit 201C3 may amplify and output the detection signal RS. For example, the signal receiving unit 201C3 may be implemented with an analog front end (AFE) including an amplifier AMP. The amplifier AMP may include an operational amplifier (OP Amp).

The signal receiving unit 201C3 may include a first input terminal IN1 and a second input terminal IN2.

The second electrode 220 may be electrically connected to the first input terminal IN1 of the signal receiving unit 201C3. That is, an inverting input terminal of the amplifier AMP may be electrically connected to the second electrode 220. The measurement signal MS may be input to the first input terminal IN1. A capacitor Ca and a switch SWr may be connected in parallel between the first input terminal IN1 and an output terminal.

A ground electrode GND may be electrically connected to the second input terminal IN2 of the signal receiving unit 201C3. That is, a non-inverting input terminal of the amplifier AMP may be grounded by being connected to the ground electrode GND as a reference terminal.

The signal receiving unit 201C3 may output a signal corresponding to a voltage difference between the first input terminal IN1 and the second input terminal IN2.

The conversion circuit 202C3 may convert an analog signal input from the signal receiving unit 201C3 into a digital signal. The conversion circuit 202C3 may include an analog-to-digital converter ADC.

The signal processing unit 203C3 may process the converted signal (the digital signal) from the conversion circuit 202C3 and may detect whether the sensor layer 200 is defective, based on the signal processing result. The signal processing unit 203C3 may output a first signal DATA1. The first signal DATA1 may include the measured mutual capacitance value. For example, the signal processing unit 203C3 may detect the mutual capacitance between the first electrode 210 and the second electrode 220 by comprehensively analyzing signals input from the plurality of second electrode 220 via the signal receiving unit 201C3 and the conversion circuit 202C3. In some embodiments, the signal processing unit 203C3 may be implemented with a microprocessor MPU or a microcontroller MCU.

Figure 12A:
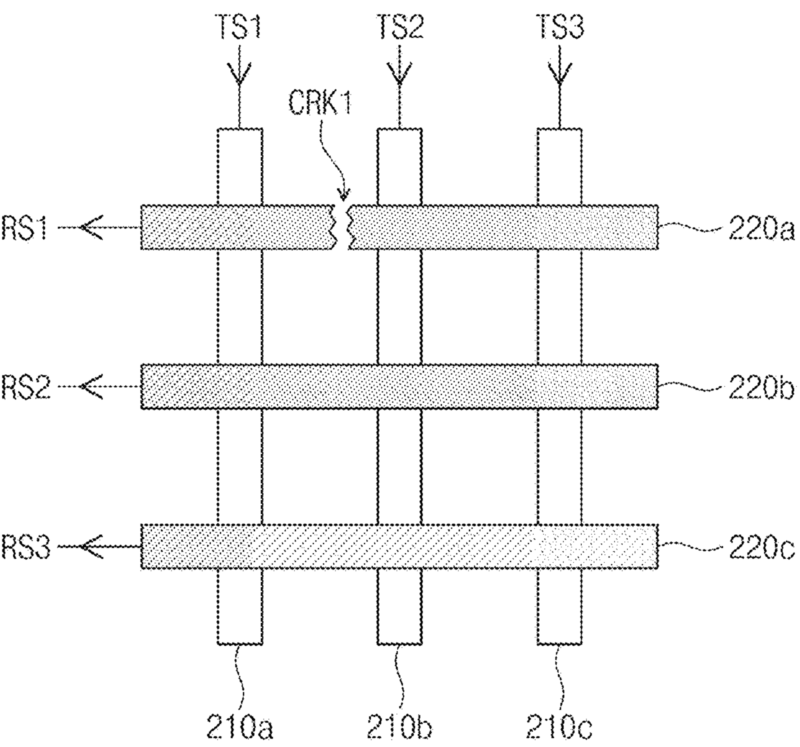
FIG. 12A is a plan view illustrating a region corresponding to region AA' of FIG. 10 according to some embodiments of the present disclosure.

FIG. 12A is a plan view illustrating a region corresponding to region AA' of FIG. 10 according to some embodiments of the present disclosure.

FIG. 12A illustrates a case in which one second electrode 220*a* among the plurality of second electrodes 220 has a first open circuit defect CRK1. In FIG. 12A, three first electrodes 210 and three second electrodes 220 are illustrated as an example.

Referring to FIGS. 10 to 12A, a first test signal TS1 may be provided to a first first-electrode 210*a*. A second test signal TS2 may be provided to a second first-electrode 210*b*. A third test signal TS3 may be provided to a third first-electrode 210*c*.

A first detection signal RS1 may be output from the first second-electrode 220*a*. A second detection signal RS2 may be output from a second second-electrode 220*b*. A third detection signal RS3 may be output from a third second-electrode 220*c*.

The first second-electrode 220*a* may have the first open circuit defect CRK1. Due to the first open circuit defect CRK1, the resistance of the first second-electrode 220*a* may be increased, compared to that of the normal second electrode 220*b* or 220*c*. The resistance may range from 1 kΩ to 500 kΩ. In this case, the first second-electrode 220*a* may be defined as having a micro open defect. For example, the first defect CRK1 may be generated due to a process error that occurs in the formation of the metal mesh pattern of the second electrode 220 or corrosion of the second electrode 220.

Due to the resistance, even though the first to third test signals TS1, TS2, and TS3 are provided, the first detection signal RS1 measured from the first second-electrode 220*a* may have lower mutual capacitance than the second detection signal RS2 and the third detection signal RS3.

The controller 200C may measure first mutual capacitance from one second electrode 220*a* among the plurality of second electrodes 220 and may measure reference mutual capacitance from another second electrode 220*b* or 220*c* among the plurality of second electrodes 220. The reference mutual capacitance may be mutual capacitance measured from the normal second electrode 220 that does not have the first open circuit defect CRK1.

The controller 200C may compare the first mutual capacitance and the reference mutual capacitance and may determine whether the sensor layer 200 is defective. When the first mutual capacitance differs from the reference mutual capacitance, the controller 200C may determine that the sensor layer 200 is defective. For example, when the first mutual capacitance is less than the reference mutual capacitance, the controller 200C may determine that the sensor layer 200 is defective.

Figure 12B:
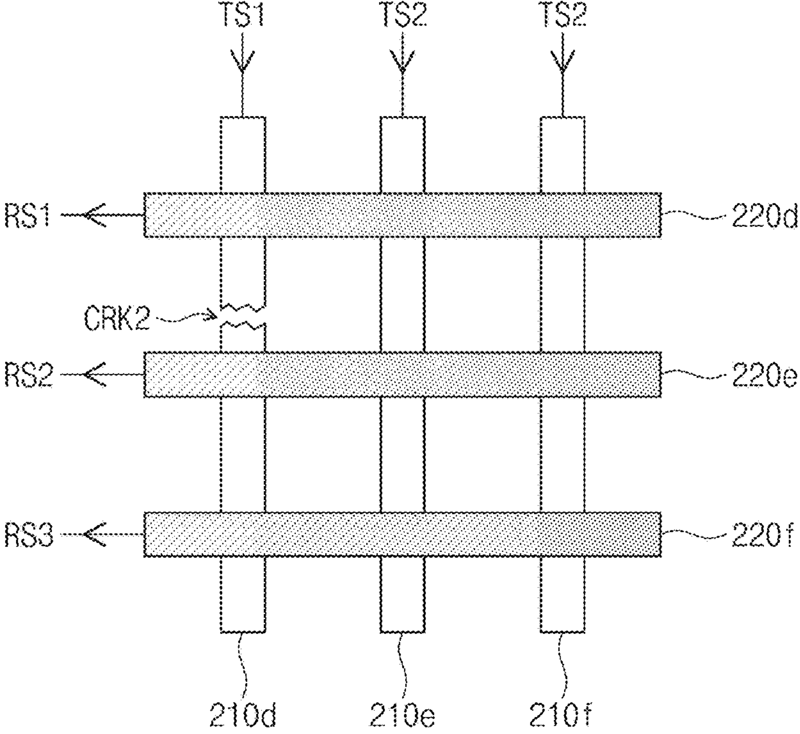
FIG. 12B is a plan view illustrating a region corresponding to region AA' of FIG. 10 according to some embodiments of the present disclosure.

FIG. 12B is a plan view illustrating a region corresponding to the region AA' of FIG. 10 according to some embodiments of the present disclosure.

FIG. 12B illustrates a case in which one first electrode 210*d* among the plurality of first electrodes 210 has a second open circuit defect CRK2. In FIG. 12B, three first electrodes 210 and three second electrodes 220 are illustrated as an example.

Referring to FIGS. 10, 11, and 12B, a first test signal TS1 may be provided to the first first-electrode 210*d*. A second test signal TS2 may be provided to a second first-electrode 210*e*. A third test signal TS3 may be provided to a third first-electrode 210*f*.

A first detection signal RS1 may be output from a first second-electrode 220*d*. A second detection signal RS2 may be output from a second second-electrode 220*e*. A third detection signal RS3 may be output from a third second-electrode 220*f*.

The first first-electrode 210*d* may have the second open circuit defect CRK2. Due to the second open circuit defect CRK2, the resistance of the first first-electrode 210*d* may be increased, compared to that of the normal first electrode 210*e* or 210*f*. The resistance may range from 1 kΩ to 500 kΩ. In this case, the first first-electrode 210*d* may be defined as having a micro open defect. For example, the second defect CRK2 may be generated due to a process error that occurs in the formation of the metal mesh pattern of the first electrode 210 or corrosion of the first electrode 210.

Due to the resistance, even though the first test signal TS1 is provided through the first first-electrode 201*d*, the first to third detection signals RS1, RS2, and RS3 may have lower mutual capacitance than the first to third detection signals RS1, RS2, and RS3 measured based on the second test signal TS2 or the third test signal TS3.

The controller 200C may measure first mutual capacitance with one first electrode 210*d* among the plurality of first electrodes 210 through the plurality of second electrodes 220 and may measure reference mutual capacitance with another first electrode 210*e* or 210*f* among the plurality of first electrodes 210 through the plurality of second electrodes 220. The reference mutual capacitance may be mutual capacitance between the first electrode 210 that does not have the second open circuit defect CRK2 and the second electrode 220.

The controller 200C may compare the first mutual capacitance and the reference mutual capacitance and may determine whether the sensor layer 200 is defective. When the first mutual capacitance differs from the reference mutual capacitance, the controller 200C may determine that the sensor layer 200 is defective. For example, when the first mutual capacitance is less than the reference mutual capacitance, the controller 200C may determine that the sensor layer 200 is defective.

Figure 12C:
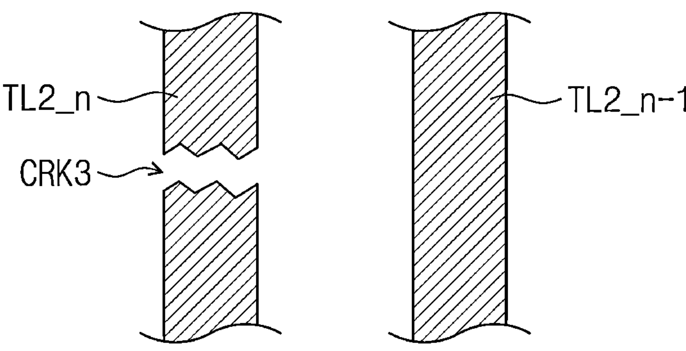
FIG. 12C is a plan view illustrating a region corresponding to region BB' of FIG. 10 according to some embodiments of the present disclosure.

FIG. 12C is a plan view illustrating a region corresponding to region BB' of FIG. 10 according to some embodiments of the present disclosure.

FIG. 12C illustrates a case in which one detection line TL2_*n* among the plurality of detection lines TL1, TL2, and TL3 (refer to FIG. 7) has a third open circuit defect CRK3. In FIG. 12C, two detection lines TL2_*n* and TL2_*n*−1 are illustrated as an example.

Referring to FIGS. 10 and 12C, the first second-detection line TL2_*n* may have the third open circuit defect CRK3. Due to the third open circuit defect CRK3, the resistance of the first second-detection line TL2_*n* may be increased, compared to that of the normal second second-detection line TL2_*n*−1. The resistance may range from 1 kΩ to 500 kΩ.

In this case, the first second-detection line TL2_n may be defined as having a micro open defect. For example, the third open circuit defect CRK3 may be generated due to a design error of the detection lines TL1, TL2, and TL3 (refer to FIG. 7) or corrosion of the detection lines TL1, TL2, and TL3.

Due to the resistance, even though a detection signal RSn is provided through the first second-detection line TL2_n, the detection signal RSn may have lower mutual capacitance than the detection signal RSn−1 provided through the second second-detection line TL2_n−1.

The controller 200C may measure first mutual capacitance from one detection line TL2_n among the plurality of detection lines TL1, TL2, and TL3 (refer to FIG. 7) and may measure reference mutual capacitance from another detection line TL2_n−1 among the plurality of detection lines TL1, TL2, and TL3 (refer to FIG. 7). The reference mutual capacitance may be mutual capacitance measured from the normal detection lines TL1, TL2, and TL3 (refer to FIG. 7) that do not have the third open circuit defect CRK3.

The controller 200C may compare the first mutual capacitance and the reference mutual capacitance and may determine whether the sensor layer 200 is defective. When the first mutual capacitance differs from the reference mutual capacitance, the controller 200C may determine that the sensor layer 200 is defective. For example, when the first mutual capacitance is less than the reference mutual capacitance, the controller 200C may determine that the sensor layer 200 is defective.

Figure 13:
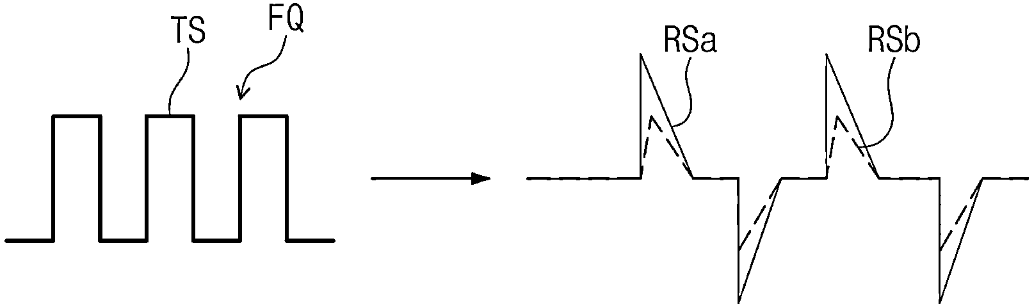
FIG. 13 is a view illustrating a test signal and detection signals according to some embodiments of the present disclosure.
Figure 14:
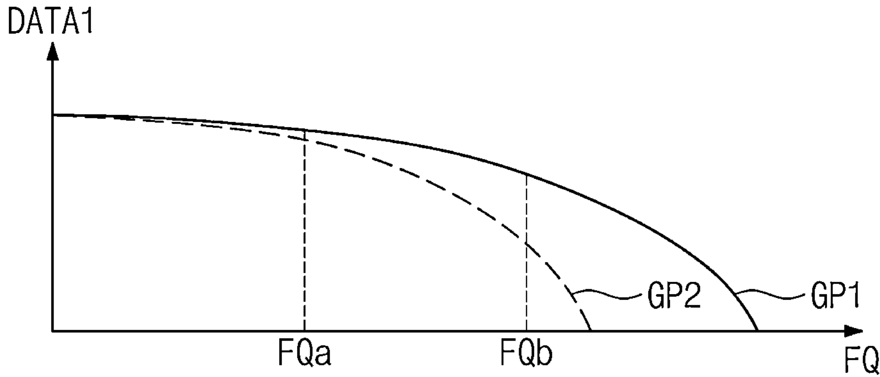
FIG. 14 is a graph depicting first signal versus test frequency according to some embodiments of the present disclosure.

FIG. 13 is a view illustrating a test signal and detection signals according to some embodiments of the present disclosure, and FIG. 14 is a graph depicting first signal versus test frequency according to some embodiments of the present disclosure.

Referring to FIGS. 7, 13, and 14, the test signal TS may have a test frequency FQ. The test frequency FQ may be higher than the touch drive frequency of the sensor layer 200. For example, the test frequency FQ may be the maximum frequency of a signal that an ASIC chip of the controller 200C is able to generate. The test frequency FQ may range from 400 kilohertz (kHz) to 1 megahertz (MHz). The test signal TS may be provided to the plurality of first electrodes 210.

The detection signals RSa and RSb may be output from the plurality of second electrodes 220. The detection signals RSa and RSb may be defined as mutual capacitances charged between the first electrodes 210 and the second electrodes 220 based on the test signal TS.

The detection signals RSa and RSb may include the first detection signal RSa and the second detection signal RSb. The first detection signal RSa may be mutual capacitance measured from the electrodes 210 and 220 and the detection lines TL1, TL2, and TL3 that are not defective.

The second detection signal RSb may be mutual capacitance measured when at least one of the electrodes 210 or 220 or the detection lines TL1, TL2, or TL3 has a micro open defect. When the micro open defect occurs, the resistance of the electrodes 210 and 220 and the detection lines TL1, TL2, and TL3 may be higher than that when the electrodes 210 and 220 and the detection lines TL1, TL2, and TL3 are normal. The resistance may range from 1 kΩ to 500 kΩ. The amount of charge in the second electrodes 220 may be decreased by the resistance. Due to this, the second detection signal RSb may have a lower value than the first detection signal RSa.

The horizontal axis of FIG. 14 may refer to the test frequency FQ. The vertical axis of FIG. 14 may refer to the first signal DATA1 output from the signal processing unit 203C3. The first signal DATA1 may be output based on the detection signals RSa and RSb.

A first graph GP1 may be a graph depicting the first detection signal RSa for each test frequency FQ. A second graph GP2 may be a graph depicting the second detection signal RSb for each test frequency FQ.

A first test frequency FQa may be equal to the touch drive frequency of the sensor layer 200. For example, the first test frequency FQa may be 350 KHz.

A second test frequency FQb may be higher than the first test frequency FQa. The second test frequency FQb may be higher than the touch drive frequency. For example, the second test frequency FQb may be 500 KHz.

Unlike in the present disclosure, when the first signal DATA1 of the first graph GP1 and the first signal DATA1 of the second graph GP2 measured at the first test frequency FQa are compared, the difference may be insignificant. When determining whether the sensor layer 200 has a micro open defect, based on a test signal having the first test frequency FQa, the controller 200C may fail to determine whether the sensor layer 200 is defective. However, according to the present disclosure, when the first signal DATA1 of the first graph GP1 and the first signal DATA1 of the second graph GP2 measured at the second test frequency FQb are compared, the difference may have a level at which the controller 200C is able to determine that the sensor layer 200 is defective. When the sensor layer 200 has a micro open defect, the controller 200C may determine whether the sensor layer 200 is defective, by using a test signal TS having the second test frequency FQb. Accordingly, the sensor layer 200 that is likely to malfunction and fail to recognize the user's body 2000 (refer to FIG. 2) may be prevented from being provided to the user. Thus, the electronic device 1000 (refer to FIG. 1) and the electronic device testing method that have relatively improved reliability may be provided.

Figure 15:
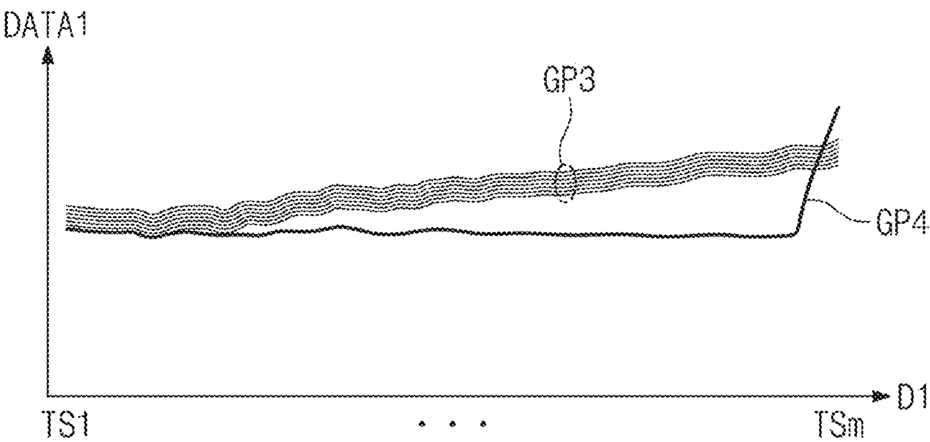
FIG. 15 is a graph depicting first signal versus test signal according to some embodiments of the present disclosure.

FIG. 15 is a graph depicting first signal versus test signal according to some embodiments of the present disclosure. In describing FIG. 15, the components described with reference to FIG. 14 will be assigned with identical reference numerals, and descriptions thereabout will be omitted.

FIG. 15 illustrates a graph measured when one of the plurality of second electrodes 220 has a open circuit defect.

The horizontal axis of FIG. 15 may refer to the plurality of test signals TS1 to TSm. The vertical axis of FIG. 15 may refer to the first signal DATA1 output from the signal processing unit 203C3 (refer to FIG. 11).

Referring to FIGS. 10 and 15, a plurality of third graphs GP3 and a fourth graph GP4 may be graphs depicting the first signals DATA1 obtained by measuring the plurality of second electrodes 220 for the respective test signals TS1 to TSm. The plurality of third graphs GP3 and the fourth graph GP4 may be graphs measured at a test frequency higher than the touch drive frequency of the sensor layer 200. The test frequency may be 700 KHz.

The plurality of third graphs GP3 may represent the first signals DATA1 measured from the electrodes 210 and 220 and the detection lines TL1, TL2, and TL3 (refer to FIG. 7) that are not defective.

The fourth graph GP4 may represent the first signal DATA1 measured when at least one of the plurality of second electrodes 220 has a micro open defect.

The plurality of third graphs GP3 may represent the first signals DATA1 measured from the at least one second electrode and another one of the second electrodes 220 that is adjacent to the at least one second electrode. In this case, the at least one second electrode is referred to as an open channel, and the other second electrode is referred to as an adjacent channel.

Table 1 shows the difference between the open channel and the adjacent channel depending on the degree to which the sensor layer 200 is defective, and the percentage of the difference.

In Table 1, the first signal DATA1 measured based on any one test signal among the plurality of test signals TS1 to TSm is illustrated. The first signal DATA1 represents a signal output from the controller 200C as a numerical value having a Femtofarad unit, and the value of the first signal DATA1 is not limited thereto. For example, the first signal DATA1 may be converted into a code value that can be easily controlled by the controller 200C.

TABLE 1

| Open Level [Ω] | First Signal (DATA1) | | |
|---|---|---|---|
| | Open Channel | Adjacent Channel | Difference from Adjacent Channel |
| 400 | 552.2 | 614 | 10% |
| 1k | 401.5 | 623.8 | 36% |
| 3k | 176.1 | 623.8 | 72% |
| 5k | 106 | 623.8 | 83% |

Referring to Table 1 and FIG. 15, when a open circuit of a 400Ω level occurs in the one second electrode among the plurality of second electrodes 220, a first mutual capacitance of 552.2 femtofarad (fF) may be measured from the open channel. A second mutual capacitance of 614 fF may be measured from the adjacent channel. A value of 10% may be calculated by dividing the difference from the adjacent channel by the second mutual capacitance. When the percentage is 20% or more, the controller 200C may determine that the sensor layer 200 is defective. That is, when the open circuit of the 400Ω level occurs, the controller 200C may determine that the sensor layer 200 is a good product, without determining that the open circuit has a level that causes an abnormality in the operation of the sensor layer 200. However, this is illustrative, and the percentage for determining whether the sensor layer 200 is defective according to some embodiments of the present disclosure is not limited thereto. For example, when the percentage is 30% or more, the controller 200C may determine that the sensor layer 200 is defective.

When a open circuit of a 1 kΩ level occurs in the one second electrode among the plurality of second electrodes 220, a first mutual capacitance of 401.5 fF may be measured from the open channel. A second mutual capacitance of 623.8 fF may be measured from the adjacent channel. A value of 36% may be calculated by dividing the difference from the adjacent channel by the second mutual capacitance.

When the open circuit of the 1 kΩ level occurs, the controller 200C may determine that the sensor layer 200 is defective.

When a open circuit of a 3 kΩ level occurs in the one second electrode among the plurality of second electrodes 220, a first mutual capacitance of 176.1 fF may be measured from the open channel. A second mutual capacitance of 623.8 fF may be measured from the adjacent channel. A value of 72% may be calculated by dividing the difference from the adjacent channel by the second mutual capacitance.

When the open circuit of the 3 kΩ level occurs, the controller 200C may determine that the sensor layer 200 is defective.

When a open circuit of a 5 kΩ level occurs in the one second electrode among the plurality of second electrodes 220, a first mutual capacitance of 105 fF may be measured from the open channel. A second mutual capacitance of 623.8 fF may be measured from the adjacent channel. A value of 83% may be calculated by dividing the difference from the adjacent channel by the second mutual capacitance.

When the open circuit of the 5 kΩ level occurs, the controller 200C may determine that the sensor layer 200 is defective.

When at least one of the plurality of second electrodes 220 has a defect, resistance in units of kΩ may be generated. In this case, the sensor layer 200 may malfunction and may fail to recognize the user's body 2000 (refer to FIG. 2). However, according to the present disclosure, when the sensor layer 200 has a micro open defect, the controller 200C may determine whether the sensor layer 200 is defective, by comparing mutual capacitances measured using a test frequency of 700 KHz. Accordingly, the sensor layer 200 that is likely to malfunction and fail to recognize the user's body 2000 (refer to FIG. 2) may be prevented from being provided to the user. Thus, the electronic device 1000 (refer to FIG. 1) and the electronic device testing method that have relatively improved reliability may be provided.

Figure 16:
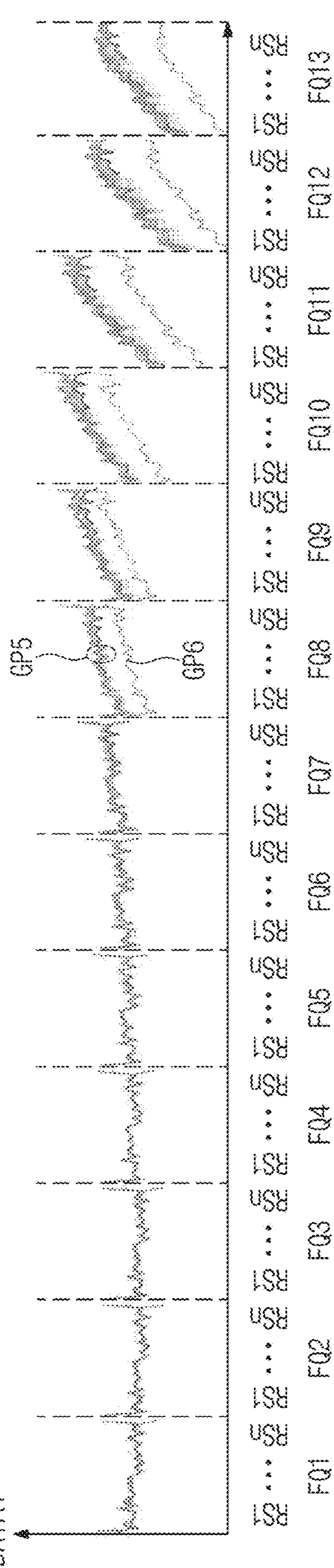
FIG. 16 is a graph depicting first signal versus detection signal according to some embodiments of the present disclosure.

FIG. 16 is a graph depicting first signal versus detection signal according to some embodiments of the present disclosure. In describing FIG. 16, the components described with reference to FIG. 14 will be assigned with identical reference numerals, and descriptions thereabout will be omitted.

FIG. 16 illustrates a case in which one of the plurality of first electrodes 210 has a open circuit defect.

The horizontal axis of FIG. 16 may refer to the plurality of detection signals RS1 to RSn. The vertical axis of FIG. 16 may refer to the first signal DATA1 output from the signal processing unit 203C3 (refer to FIG. 11).

Referring to FIGS. 10 and 16, a plurality of fifth graphs GP5 and a plurality of sixth graph GP6 may be graphs depicting the first signals DATA1 obtained by measuring the plurality of first electrodes 210 for the respective detection signals RS1 to RSn.

The plurality of fifth graphs GP5 may represent the first signals DATA1 measured from the electrodes 210 and 220 and the detection lines TL1, TL2, and TL3 (refer to FIG. 7) that are not defective.

The plurality of sixth graphs GP6 may represent the first signals DATA1 measured when at least one of the plurality of first electrodes 210 has a micro open defect.

The plurality of fifth graphs GP5 may represent the first signals DATA1 measured from the at least one first electrode and another one of the first electrodes 210 that is adjacent to the at least one first electrode. In this case, the at least one first electrode is referred to as an open channel, and the other first electrode is referred to as an adjacent channel.

Table 2 shows percentages of differences from the adjacent channel depending on a plurality of test frequencies FQ.

TABLE 2

| Test Frequency FQ [kHz] | Difference from Adjacent Channel [%] |
|---|---|
| 15 | 0 |
| 50 | 0 |
| 150 | 0 |
| 180 | 0 |
| 200 | 4 |
| 220 | 4 |

TABLE 2-continued

| Test Frequency FQ [kHz] | Difference from Adjacent Channel [%] |
|---|---|
| 250 | 5 |
| 300 | 9 |
| 350 | 18 |
| 400 | 24 |
| 500 | 38 |
| 600 | 47 |
| 700 | 49 |

Referring to Table 2 and FIGS. 10 and 16, the plurality of test frequencies FQ may be provided. The test frequencies FQ may include a first test frequency FQ1, a second test frequency FQ2, a third test frequency FQ3, a fourth test frequency FQ4, a fifth test frequency FQ5, a sixth test frequency FQ6, a seventh test frequency FQ7, an eighth test frequency FQ8, a ninth test frequency FQ9, a tenth test frequency FQ10, an eleventh test frequency FQ11, a twelfth test frequency FQ12, and a thirteenth test frequency FQ13 that differ from one another. According to the present disclosure, the user may sequentially examine whether the sensor layer 200 is defective, by using test signals having the plurality of test frequencies FQ, may select an optimum test frequency FQ for testing the electronic device 1000 (refer to FIG. 1), and thereafter may easily determine whether the sensor layer 200 is defective, when the electronic device 1000 (refer to FIG. 1) is tested. Thus, the electronic device 1000 (refer to FIG. 1) and the electronic device testing method that have relatively improved reliability may be provided.

The first test frequency FQ1 may be 15 kHz. The controller 200C may provide a first test signal having the first test frequency FQ1 to the plurality of first electrodes 210. The controller 200C may measure first mutual capacitance based on the first test signal. The controller 200C may determine whether the sensor layer 200 is defective, based on the first mutual capacitance. When the percentage of the difference from the adjacent channel is calculated based on the first mutual capacitance measured from the open channel and reference mutual capacitance measured from the adjacent channel, a value of 0% may be calculated.

After determining whether the sensor layer 200 is defective, by using the first test signal having the first test frequency FQ1, the controller 200C may determine whether the sensor layer 200 is defective, by using a second test signal having the second test frequency FQ2.

The second test frequency FQ2 may be higher than the first test frequency FQ1. The second test frequency FQ2 may be 50 kHz. The controller 200C may provide the second test signal having the second test frequency FQ2 to the plurality of first electrodes 210. The controller 200C may measure second mutual capacitance based on the second test signal. The controller 200C may determine whether the sensor layer 200 is defective, based on the second mutual capacitance. When the percentage of the difference from the adjacent channel is calculated based on the second mutual capacitance measured from the open channel and the reference mutual capacitance measured from the adjacent channel, a value of 0% may be calculated.

The third test frequency FQ3 may be higher than the second test frequency FQ2. The third test frequency FQ3 may be 150 kHz. The controller 200C may provide a third test signal having the third test frequency FQ3 to the plurality of first electrodes 210. The controller 200C may measure third mutual capacitance based on the third test signal. The controller 200C may determine whether the sensor layer 200 is defective, based on the third mutual capacitance. When the percentage of the difference from the adjacent channel is calculated based on the third mutual capacitance measured from the open channel and the reference mutual capacitance measured from the adjacent channel, a value of 0% may be calculated.

The fourth test frequency FQ4 may be higher than the third test frequency FQ3. The fourth test frequency FQ4 may be 180 KHz. The controller 200C may provide a fourth test signal having the fourth test frequency FQ4 to the plurality of first electrodes 210. The controller 200C may measure fourth mutual capacitance based on the fourth test signal. The controller 200C may determine whether the sensor layer 200 is defective, based on the fourth mutual capacitance. When the percentage of the difference from the adjacent channel is calculated based on the fourth mutual capacitance measured from the open channel and the reference mutual capacitance measured from the adjacent channel, a value of 0% may be calculated.

The fifth test frequency FQ5 may be higher than the fourth test frequency FQ4. The fifth test frequency FQ5 may be 200 kHz. The controller 200C may provide a fifth test signal having the fifth test frequency FQ5 to the plurality of first electrodes 210. The controller 200C may measure fifth mutual capacitance based on the fifth test signal. The controller 200C may determine whether the sensor layer 200 is defective, based on the fifth mutual capacitance. When the percentage of the difference from the adjacent channel is calculated based on the fifth mutual capacitance measured from the open channel and the reference mutual capacitance measured from the adjacent channel, a value of 4% may be calculated.

The sixth test frequency FQ6 may be higher than the fifth test frequency FQ5. The sixth test frequency FQ6 may be 220 kHz. The controller 200C may provide a sixth test signal having the sixth test frequency FQ6 to the plurality of first electrodes 210. The controller 200C may measure sixth mutual capacitance based on the sixth test signal. The controller 200C may determine whether the sensor layer 200 is defective, based on the sixth mutual capacitance. When the percentage of the difference from the adjacent channel is calculated based on the sixth mutual capacitance measured from the open channel and the reference mutual capacitance measured from the adjacent channel, a value of 4% may be calculated.

The seventh test frequency FQ7 may be higher than the sixth test frequency FQ6. The seventh test frequency FQ7 may be 250 kHz. The controller 200C may provide a seventh test signal having the seventh test frequency FQ7 to the plurality of first electrodes 210. The controller 200C may measure seventh mutual capacitance based on the seventh test signal. The controller 200C may determine whether the sensor layer 200 is defective, based on the seventh mutual capacitance. When the percentage of the difference from the adjacent channel is calculated based on the seventh mutual capacitance measured from the open channel and the reference mutual capacitance measured from the adjacent channel, a value of 5% may be calculated.

The eighth test frequency FQ8 may be higher than the seventh test frequency FQ7. The eighth test frequency FQ8 may be 300 kHz. The controller 200C may provide an eighth test signal having the eighth test frequency FQ8 to the plurality of first electrodes 210. The controller 200C may measure eighth mutual capacitance based on the eighth test signal. The controller 200C may determine whether the sensor layer 200 is defective, based on the eighth mutual capacitance. When the percentage of the difference from the adjacent channel is calculated based on the eighth mutual capacitance measured from the open channel and the reference mutual capacitance measured from the adjacent channel, a value of 9% may be calculated.

The ninth test frequency FQ9 may be higher than the eighth test frequency FQ8. The ninth test frequency FQ9 may be 350 kHz. The controller 200C may provide a ninth test signal having the ninth test frequency FQ9 to the plurality of first electrodes 210. The controller 200C may measure ninth mutual capacitance based on the ninth test signal. The controller 200C may determine whether the sensor layer 200 is defective, based on the ninth mutual capacitance. When the percentage of the difference from the adjacent channel is calculated based on the ninth mutual capacitance measured from the open channel and the reference mutual capacitance measured from the adjacent channel, a value of 18% may be calculated.

The tenth test frequency FQ10 may be higher than the ninth test frequency FQ9. The tenth test frequency FQ10 may be 400 kHz. The controller 200C may provide a tenth test signal having the tenth test frequency FQ10 to the plurality of first electrodes 210. The controller 200C may measure tenth mutual capacitance based on the tenth test signal. The controller 200C may determine whether the sensor layer 200 is defective, based on the tenth mutual capacitance. When the percentage of the difference from the adjacent channel is calculated based on the tenth mutual capacitance measured from the open channel and the reference mutual capacitance measured from the adjacent channel, a value of 24% may be calculated.

When the percentage is 20% or more, the controller 200C may determine that the sensor layer 200 is defective. The controller 200C may easily determine whether the sensor layer 200 is defective, by selecting the tenth test frequency FQ10 or a test frequency higher than the tenth test frequency FQ10 among the plurality of test frequencies FQ when testing the electronic device 1000 (refer to FIG. 1) later.

The eleventh test frequency FQ11 may be higher than the tenth test frequency FQ10. The eleventh test frequency FQ11 may be 500 kHz. The controller 200C may provide an eleventh test signal having the eleventh test frequency FQ11 to the plurality of first electrodes 210. The controller 200C may measure eleventh mutual capacitance based on the eleventh test signal. The controller 200C may determine whether the sensor layer 200 is defective, based on the eleventh mutual capacitance. When the percentage of the difference from the adjacent channel is calculated based on the eleventh mutual capacitance measured from the open channel and the reference mutual capacitance measured from the adjacent channel, a value of 38% may be calculated.

When the percentage is 20% or more, the controller 200C may determine that the sensor layer 200 is defective.

The twelfth test frequency FQ12 may be higher than the eleventh test frequency FQ11. The twelfth test frequency FQ12 may be 600 kHz. The controller 200C may provide a twelfth test signal having the twelfth test frequency FQ12 to the plurality of first electrodes 210. The controller 200C may measure twelfth mutual capacitance based on the twelfth test signal. The controller 200C may determine whether the sensor layer 200 is defective, based on the twelfth mutual capacitance. When the percentage of the difference from the adjacent channel is calculated based on the twelfth mutual capacitance measured from the open channel and the reference mutual capacitance measured from the adjacent channel, a value of 47% may be calculated.

When the percentage is 20% or more, the controller 200C may determine that the sensor layer 200 is defective.

The thirteenth test frequency FQ13 may be higher than the twelfth test frequency FQ12. The thirteenth test frequency FQ13 may be 700 kHz. The controller 200C may provide a thirteenth test signal having the thirteenth test frequency FQ13 to the plurality of first electrodes 210. The controller 200C may measure thirteenth mutual capacitance based on the thirteenth test signal. The controller 200C may determine whether the sensor layer 200 is defective, based on the thirteenth mutual capacitance. When the percentage of the difference from the adjacent channel is calculated based on the thirteenth mutual capacitance measured from the open channel and the reference mutual capacitance measured from the adjacent channel, a value of 49% may be calculated.

When the percentage is 20% or more, the controller 200C may determine that the sensor layer 200 is defective.

According to the present disclosure, the user may sequentially provide the test signals having the first to thirteenth test frequencies FQ1 to FQ13 to the sensor layer 200 and may select optimum test frequencies FQ for examining a micro open defect in the sensor layer 200. For example, the optimum test frequencies FQ may be the tenth to thirteenth test frequencies FQ10 to FQ13. The optimum test frequencies for examining the micro open defect may differ from one another depending on the type of the electronic device 1000 (refer to FIG. 1). However, whether the sensor layer 200 is defective may be examined by applying the test method of the electronic device 1000 (refer to FIG. 1) using the plurality of test frequencies FQ, comparing the percentages of the differences from the adjacent channel, and selecting a test frequency FQ appropriate for the corresponding electronic device 1000 (refer to FIG. 1). Thus, the electronic device 1000 (refer to FIG. 1) and the electronic device testing method that have relatively improved reliability may be provided.

As described above, when the sensor layer has a micro open defect, the controller may determine whether the sensor layer is defective, by comparing the mutual capacitances measured using the test frequency higher than the touch drive frequency. Accordingly, the sensor layer that is likely to malfunction and fail to recognize the user's body may be prevented from being provided to the user. Accordingly, the electronic device and the electronic device testing method having relatively improved reliability may be provided.

While the present disclosure has been described with reference to embodiments thereof, it will be apparent to those of ordinary skill in the art that various changes and modifications may be made thereto without departing from the spirit and scope of the present disclosure as set forth in the following claims, and their equivalents.

What is claimed is:

1. A method for testing an electronic device, the method comprising:

providing the electronic device including a sensor layer and configured to operate at a touch drive frequency, the sensor layer including a plurality of first electrodes, a plurality of second electrodes insulatively intersecting the plurality of first electrodes, and a plurality of detection lines electrically connected with the plurality of first electrodes and the plurality of second electrodes;

providing a test signal having a test frequency different from the touch drive frequency to the plurality of first electrodes;

measuring a mutual capacitance with the plurality of first electrodes through the plurality of second electrodes; and determining whether or not the sensor layer is defective based on the mutual capacitance, wherein the determining whether or not the sensor layer is defective includes determining whether or not the plurality of detection lines are defective.

2. The method of claim 1, wherein the test frequency is in a range of 400 kilohertz (kHz) to 1 megahertz (MHz).

3. The method of claim 1, wherein measuring the mutual capacitance includes:

measuring a first mutual capacitance from one second electrode among the plurality of second electrodes; and measuring a second mutual capacitance from another second electrode among the plurality of second electrodes, and wherein the determining whether the sensor layer is defective includes determining that the one second electrode among the plurality of second electrodes is open-circuited, based on the first mutual capacitance and the second mutual capacitance differing from each other.

4. The method of claim 1, wherein the providing the test signal includes:

providing the test signal to one first electrode among the plurality of first electrodes; and providing the test signal to an other first electrode among the plurality of first electrodes, wherein the measuring the mutual capacitance includes:

measuring a first mutual capacitance with the one first electrode among the plurality of first electrodes through the plurality of second electrodes; and measuring a second mutual capacitance with the other first electrode among the plurality of first electrodes through the plurality of second electrodes, and wherein determining whether or not the sensor layer is defective includes determining that the one first electrode among the plurality of first electrodes is open-circuited, based on the first mutual capacitance and the second mutual capacitance differing from each other.

5. The method of claim 1, wherein the determining whether or not the sensor layer is defective includes determining that the sensor layer is defective, based on an open circuit having a resistance in a range of 1 kΩ to 500 kΩ occurring in one of the plurality of first electrodes and the plurality of second electrodes.

6. The method of claim 1, wherein the measuring the mutual capacitance includes:

measuring a first mutual capacitance of one first electrode among the plurality of first electrodes; and measuring a second mutual capacitance of another adjacent first electrode among the plurality of first electrodes, and wherein the determining whether or not the sensor layer is defective includes determining that the sensor layer is defective, based on a percentage of a value obtained by dividing a difference between the first mutual capacitance and the second mutual capacitance by the second mutual capacitance being 20% or more.

7. The method of claim 1, wherein the test frequency includes a plurality of test frequencies, and the plurality of test frequencies include a first test frequency and a second test frequency higher than the first test frequency, and wherein the providing the test signal includes:

providing a first test signal having the first test frequency to the plurality of first electrodes; and providing a second test signal having the second test frequency to the plurality of first electrodes.

8. The method of claim 7, wherein the measuring the mutual capacitance includes:

measuring a first mutual capacitance, based on the first test signal; and measuring a second mutual capacitance, based on the second test signal, and wherein the determining whether or not the sensor layer is defective includes:

determining whether or not the sensor layer is defective, based on the first mutual capacitance; and determining whether or not the sensor layer is defective, based on the second mutual capacitance.

9. The method of claim 8, wherein the determining whether or not the sensor layer is defective, based on the second mutual capacitance is performed after the determining of whether or not the sensor layer is defective, based on the first mutual capacitance.

10. The method of claim 1, wherein the electronic device further includes a controller configured to control the sensor layer, and wherein the providing of the test signal includes providing, by the controller, the test signal to the plurality of first electrodes.

11. An electronic device comprising:

a display layer;

a sensor layer on the display layer and configured to operate at a touch drive frequency, the sensor layer including a plurality of first electrodes, a plurality of second electrodes insulatively intersecting the plurality of first electrodes, and a plurality of detection lines electrically connected with the plurality of first electrodes and the plurality of second electrodes; and a controller configured to control the sensor layer, wherein the controller is configured to provide a test signal having a test frequency different from the touch drive frequency to the plurality of first electrodes, measure mutual capacitance with the plurality of first electrodes through the plurality of second electrodes, and determine whether or not the sensor layer is defective, based on the mutual capacitance, and wherein the controller is configured to determine whether or not the plurality of detection lines are defective, based on the mutual capacitances capacitance.

12. The electronic device of claim 11, wherein the test frequency is in a range of 400 kilohertz (kHz) to 1 megahertz (MHz).

13. The electronic device of claim 11, wherein the plurality of first electrodes include a plurality of detection patterns arranged in a first direction and at least one connecting pattern configured to connect two detection patterns adjacent to each other among the plurality of detection patterns, and wherein the plurality of second electrodes include a plurality of first portions arranged in a second direction crossing the first direction and a second portion configured to connect two first portions adjacent to each other among the plurality of first portions.

14. The electronic device of claim 13, wherein the connecting pattern and the second portion are in different layers.

15. The electronic device of claim 13, wherein the plurality of detection patterns and the plurality of first portions have a mesh pattern.

16. The electronic device of claim 11, wherein the controller is further configured to measure first mutual capacitance from one second electrode among the plurality of second electrodes and to measure second mutual capacitance from another second electrode among the plurality of second electrodes, and wherein the controller is configured to determine whether or not the sensor layer is defective, by comparing the first mutual capacitance and the second mutual capacitance.

17. The electronic device of claim 16, wherein the controller is further configured to determine that the one second electrode among the plurality of second electrodes is open-circuited, based on the first mutual capacitance being less than the second mutual capacitance.

18. The electronic device of claim 17, wherein the one second electrode among the plurality of second electrodes has a resistance in a range of 1 kΩ to 500 kΩ based on an open circuit occurring.

* * * * *